United States Patent
Satake et al.

(10) Patent No.: US 10,261,521 B2
(45) Date of Patent: Apr. 16, 2019

(54) PROCESSING APPARATUS, PROCESSING METHOD, AND STORAGE MEDIUM

(71) Applicant: Tokyo Electron Limited, Tokyo (JP)

(72) Inventors: Keigo Satake, Kumamoto (JP); Kenji Nakamizo, Kumamoto (JP); Yuichi Douki, Kumamoto (JP); Takuro Masuzumi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 284 days.

(21) Appl. No.: 15/181,770

(22) Filed: Jun. 14, 2016

(65) Prior Publication Data

US 2016/0370810 A1 Dec. 22, 2016

(30) Foreign Application Priority Data

Jun. 16, 2015 (JP) .................................. 2015-120843
Apr. 22, 2016 (JP) .................................. 2016-086276

(51) Int. Cl.
*G06F 19/00* (2018.01)
*G05D 7/06* (2006.01)
*H01L 21/67* (2006.01)

(52) U.S. Cl.
CPC ..... *G05D 7/0635* (2013.01); *H01L 21/67051* (2013.01); *H01L 21/67253* (2013.01); *G05B 2219/41303* (2013.01)

(58) Field of Classification Search
CPC .................. H01L 21/00; G05D 7/0635; G05B 2219/41303
See application file for complete search history.

(56) References Cited

U.S. PATENT DOCUMENTS 5,997,124 A * 12/1999 Capps .................... B41J 2/0457
  347/14
2003/0109060 A1 * 6/2003 Cook .................. B01J 19/0046
  436/180

(Continued)

FOREIGN PATENT DOCUMENTS

JP 09-270373 A 10/1997
JP 2003-234280 A 8/2003
JP 2010-123709 A 6/2010

*Primary Examiner* — Michael D Masinick
*Assistant Examiner* — Hung Dang
(74) *Attorney, Agent, or Firm* — Abelman, Frayne & Schwab

(57) ABSTRACT

Disclosed is a processing apparatus including a chamber, at least one nozzle, a measuring unit, an opening/closing unit, and a controller. The chamber accommodates a workpiece therein. The nozzle is provided in the chamber to supply a processing fluid toward the workpiece. The measuring unit measures a supply flow rate of the processing fluid supplied to the nozzle. The opening/closing unit performs opening/closing of a flow path of the processing fluid to be supplied to the nozzle. The controller outputs opening and closing operation signals at a preset timing. After outputting the opening operation signal, the controller calculates an integrated amount of the processing fluid based on a measurement result of the measuring unit, and performs an output timing change processing to change a timing of outputting the opening or closing operation signal from the preset timing based on the calculated integrated amount.

11 Claims, 18 Drawing Sheets

(56) References Cited

U.S. PATENT DOCUMENTS

| | | | |
|---|---|---|---|
| 2012/0000542 A1* | 1/2012 | Eto | G05D 7/0623 |
| | | | 137/10 |
| 2015/0200116 A1* | 7/2015 | Yamada | H01L 21/67086 |
| | | | 156/345.15 |
| 2016/0240413 A1* | 8/2016 | Kobayashi | H01L 21/67017 |

* cited by examiner

PROCESSING APPARATUS, PROCESSING METHOD, AND STORAGE MEDIUM

CROSS-REFERENCE TO RELATED APPLICATIONS

This application is based on and claims priority from Japanese Patent Application Nos. 2015-120843 and 2016-086276, filed on Jun. 16, 2015 and Apr. 22, 2016, respectively, with the Japan Patent Office, the disclosures of which are incorporated herein in their entirety by reference.

TECHNICAL FIELD

An exemplary embodiment disclosed herein relates to a processing apparatus, a processing method, and a storage medium.

BACKGROUND

Conventionally, a substrate processing apparatus has been known which performs a processing on a substrate such as, for example, a semiconductor wafer or a glass substrate by supplying a processing liquid to the substrate from a nozzle provided within a chamber. In addition, the substrate processing apparatus includes a plurality of processing units, and the chamber is provided in each of the processing units.

However, the processing liquid needs to be supplied at a specific flow rate which is required for the processing of the substrate. Accordingly, a substrate processing apparatus is provided with a flowmeter in a processing liquid supply path and performs a processing liquid supply control based on a measurement result of the flowmeter so as to enable the processing liquid to be stably supplied at a specific flow rate as described above (see, e.g., Japanese Patent Laid-Open Publication No. 2003-234280).

SUMMARY

A processing apparatus according to an aspect of an exemplary embodiment includes a chamber, at least one nozzle, a measuring unit, an opening/closing unit, and a controller. The chamber accommodates an object to be processed ("workpiece") therein. The nozzle is provided within the chamber to supply a processing fluid toward the workpiece. The measuring unit measures a supply flow rate of the processing fluid supplied to the nozzle. The opening/closing unit performs opening/closing of a flow path of the processing fluid supplied to the nozzle. The controller outputs, at a preset timing, an opening operation signal to cause the opening/closing unit to perform an opening operation and a closing operation signal to cause the opening/closing unit to perform a closing operation. In addition, after outputting the opening operation signal, the controller calculates an integrated amount of the processing fluid based on a measurement result of the measuring unit when the supply flow rate changes into a preset flow rate, and performs an output timing change processing to change a timing of outputting the opening operation signal or the closing operation signal from the preset timing based on the calculated integrated amount.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
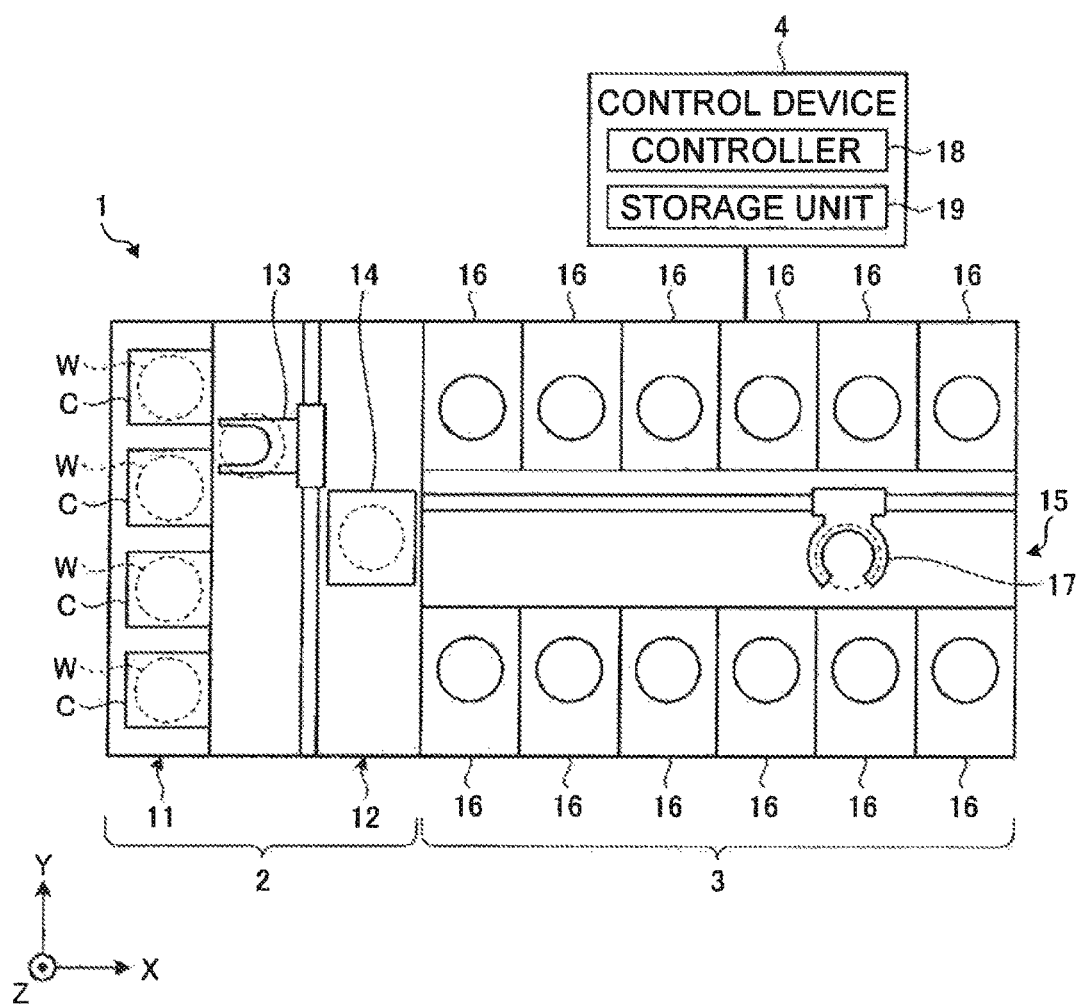
FIG. 1 is a view illustrating a schematic configuration of a substrate processing system according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The technique disclosed in Japanese Patent Laid-Open Publication No. 2003-234280 monitors a supply flow rate of a processing liquid at a time when the processing liquid is supplied at a specific flow rate, and does not monitor a time period from a timing when the processing liquid reaches a substrate until the processing liquid no longer reaches the substrate, in other words, a time during which the processing liquid is in contact with the substrate. Thus, even if a variation has occurred in substrates with respect to the time period from the timing when the processing liquid reaches the substrate until the processing liquid no longer reaches the substrate due to, for example, a machine manufacturing error or a deterioration by aging in processing units, the variation could not have been recognized. When a variation has occurred in substrates with respect to the time period from the timing when the processing liquid reaches the substrate until the processing liquid no longer reaches the substrate, a variation may be caused in the processing result of the substrate.

This problem is not limited to a liquid processing fluid, and commonly occurs in a general processing fluid including a gas. Further, the problem is not limited to a substrate processing apparatus, and also commonly occurs in a general processing apparatus which performs a processing on a workpiece by supplying a processing fluid to the workpiece.

An aspect of an exemplary embodiment provides a processing apparatus, which is capable of suppressing a variation of a processing result caused by a variation in workpieces with respect to a time from a timing when a processing fluid reaches a workpiece until the processing fluid no longer reaches the workpiece, a processing method, and a storage medium.

The processing apparatus according to the aspect of the exemplary embodiment includes a chamber, at least one nozzle, a measuring unit, an opening/closing unit, and a controller. The chamber accommodates a workpiece therein. The nozzle is provided in the chamber to supply a processing fluid toward the workpiece. The measuring unit measures a supply flow rate of the processing fluid supplied to the nozzle. The opening/closing unit performs opening/closing of a flow path of the processing fluid to be supplied to the nozzle. The controller outputs, at a preset timing, an opening operation signal to cause the opening/closing unit to perform an opening operation and a closing operation signal to cause the opening/closing unit to perform a closing operation. In addition, after outputting the opening operation signal, the controller calculates an integrated amount of the processing fluid based on a measurement result of the measuring unit when the supply flow rate changes into a preset flow rate, and performs an output timing change processing to change a timing of outputting the opening operation signal or the closing operation signal from the preset timing based on the calculated integrated amount.

In the above-described processing apparatus, the controller measures an actual elapsed time from the output of the opening operation signal until the integrated amount reaches a preset target integrated amount, and monitors a deviation between the measured actual elapsed time and a preset target elapsed time corresponding to the target integrated amount to perform the output timing change processing based on the deviation.

In the above-described processing apparatus, a plurality of chambers are provided, and the controller changes the timing of outputting the opening operation signal in the plurality of chambers so as to make constant a time from the output of the opening operation signal until a reaching timing when the processing fluid reaches a surface of the workpiece among nozzles of the plurality of chambers.

In the above-described processing apparatus, a plurality of chambers are provided, and the controller determines one of the nozzles provided in the plurality of chambers, which exhibits the latest reaching timing when the processing fluid reaches the surface of the workpiece after the output of the opening operation signal, as a reference nozzle, and delays the timing of outputting the opening operation signal based on the deviation so as to make the reaching timing of each of the other nozzles conform to the reaching timing of the reference nozzle.

In the above-described processing apparatus, a plurality of chambers are provided, and the controller determines one of the nozzles provided in the plurality of chambers, which exhibits the earliest reaching timing when the processing fluid reaches the surface of the workpiece after the output of the opening operation signal, as a reference nozzle, and advances the timing of outputting the opening operation signal based on the deviation so as to make the reaching timing of each of the other nozzles conform to the reaching timing of the reference nozzle.

In the above-described processing apparatus, the controller measures an actual elapsed time from the output of the opening operation signal until the integrated amount reaches a preset target integrated amount, and monitors a deviation between the measured actual elapsed time and a preset target elapsed time corresponding to the target integrated amount to perform the output timing change processing based on the deviation to change the timing of outputting the closing operation signal from the preset timing.

In the above-described processing apparatus, a plurality of chambers are provided, and the controller changes the timing of outputting the closing operation signal in the plurality of chambers so as to make constant a time from the reaching of the processing fluid to the surface of the workpiece until the output of the closing operation signal among nozzles of the plurality of chambers.

In the above-described processing apparatus, the processing fluid includes a chemical liquid and a rinse liquid, the opening/closing unit further includes a first valve that opens/closes a flow path of the chemical liquid and a second valve that opens/closes a flow path of the rinse liquid, and the controller supplies the chemical liquid and the rinse liquid in this order to the workpiece by outputting the opening operation signal and the closing operation signal to the first valve and the second valve at the preset timing, and changes the timing of outputting the closing operation signal to the first valve in the plurality of chambers so as to make constant the time from the reaching of the chemical liquid to the workpiece until the output of the closing operation signal among the nozzles of the plurality of chambers.

In the above-described processing apparatus, the chemical liquid and the rinse liquid are continuously supplied from the nozzles, and the controller measures an actual elapsed time of the second valve from output of the opening operation signal to the second valve until the integrated amount reaches a preset target integrated amount, and monitors a deviation between the measured actual elapsed time of the second valve and a target elapsed time of the second valve corresponding to the target integrated amount to change the timing of outputting the opening operation signal to the second valve.

The above-described processing apparatus further includes a storage unit that stores the integrated amount, and a flow rate regulator provided at an upstream side of the opening/closing unit to regulate the flow rate of the processing fluid flowing the flow path. The controller controls the flow rate regulator to open the flow path in an initial opening degree prior to the supply of the processing fluid to the nozzle and to regulate the opening degree of the flow path to reach the preset flow rate during the supply of the processing fluid to the nozzle, and performs a processing of accumulating, in the storage unit, the actual elapsed time from the output of the opening operation signal until the integrated amount reaches a preset target integrated amount, and a processing of changing the initial opening degree of the flow rate regulator based on the actual elapsed time accumulated in the storage unit after the supply of the processing fluid to the nozzle.

A processing method according to an aspect of an exemplary embodiment uses a processing apparatus that includes a chamber that accommodates a workpiece therein, at least one nozzle provided in the chamber to supply a processing fluid toward the workpiece, a measuring unit that measures a supply flow rate of the processing fluid to be supplied to the nozzle, and an opening/closing unit that performs opening/closing of a flow path of the processing fluid to be supplied to the nozzle, and includes a controlling step of outputting an opening operation signal to cause the opening/closing unit to perform an opening operation and a closing operation signal to cause the opening/closing unit to perform a closing operation, at a preset timing. After outputting the opening operation signal, the controlling step calculates an integrated amount of the processing fluid based on a measurement result of the measuring unit when the supply flow rate changes into a preset flow rate, and performs an output timing change processing to change a timing of outputting the opening operation signal or the closing operation signal from the preset timing based on the calculated integrated amount.

A computer-readable storage medium according to an aspect of an exemplary embodiment is a computer-readable storage medium that is operated on a computer and stores a program for controlling a processing device. The program, when executed, causes the computer to control the above-described processing apparatus to perform the above-described processing method.

According to an aspect of an exemplary embodiment, it is possible to suppress a variation of a processing result caused by a variation in workpieces with respect to a time from a timing when a processing fluid reaches a workpiece until the processing fluid no longer reaches the workpiece.

Hereinafter, exemplary embodiments of a processing apparatus, a processing method, and a storage medium disclosed herein will be described in detail. The present disclosure is not limited by the exemplary embodiments described below. In addition, descriptions will be made with reference to a case in which the processing apparatus is a substrate processing system, as an example.

FIG. 1 is a view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

Further, the program may be recorded in a computer-readable storage medium, and installed from the storage medium to the storage unit 19 of the control device 4. The computer-readable storage medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After processed and placed on the delivery unit 14, the wafer W returns to the carrier C of the carrier placing section 11 by the substrate transfer device 13.

Figure 2:
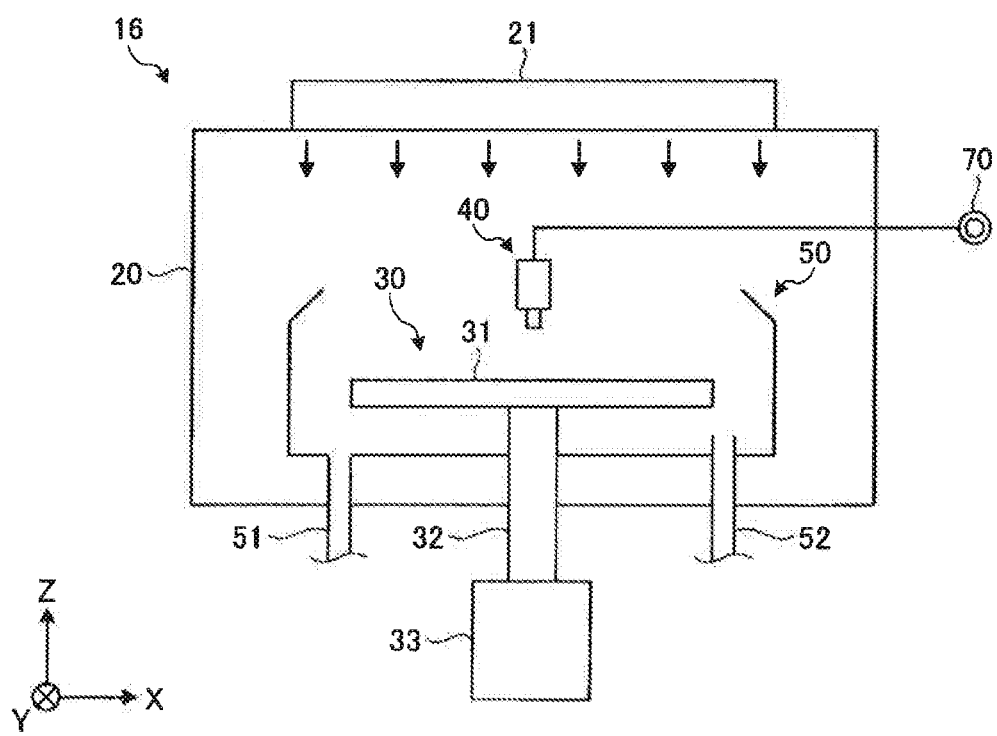
FIG. 2 is a view illustrating a schematic configuration of a processing unit.

Next, an outline of the processing unit 16 will be described with reference to FIG. 2. FIG. 2 is a view illustrating an outline of the processing liquid 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

Figure 3A:
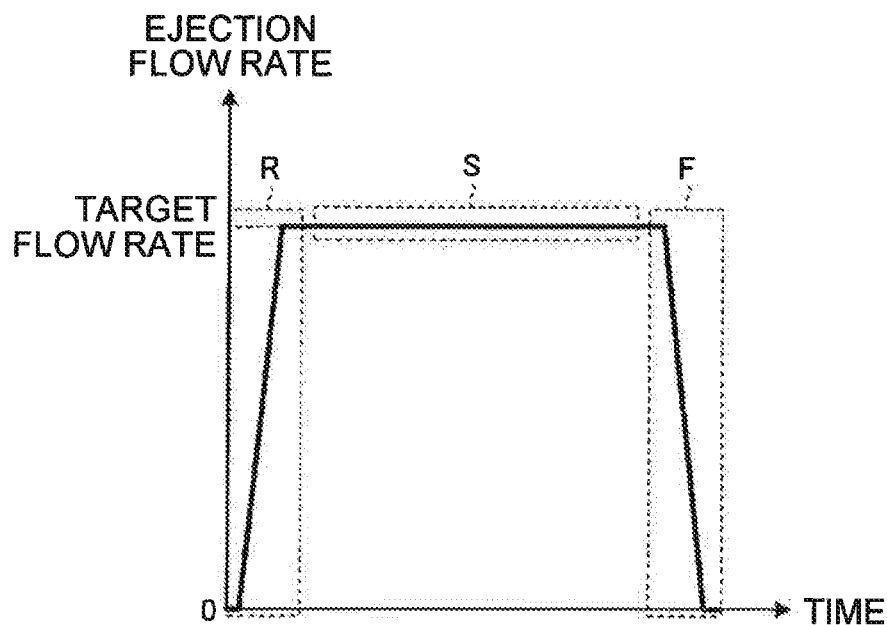
FIG. 3A is a (first) schematic explanatory view of a flow rate monitoring method according to an exemplary embodiment.
Figure 3B:
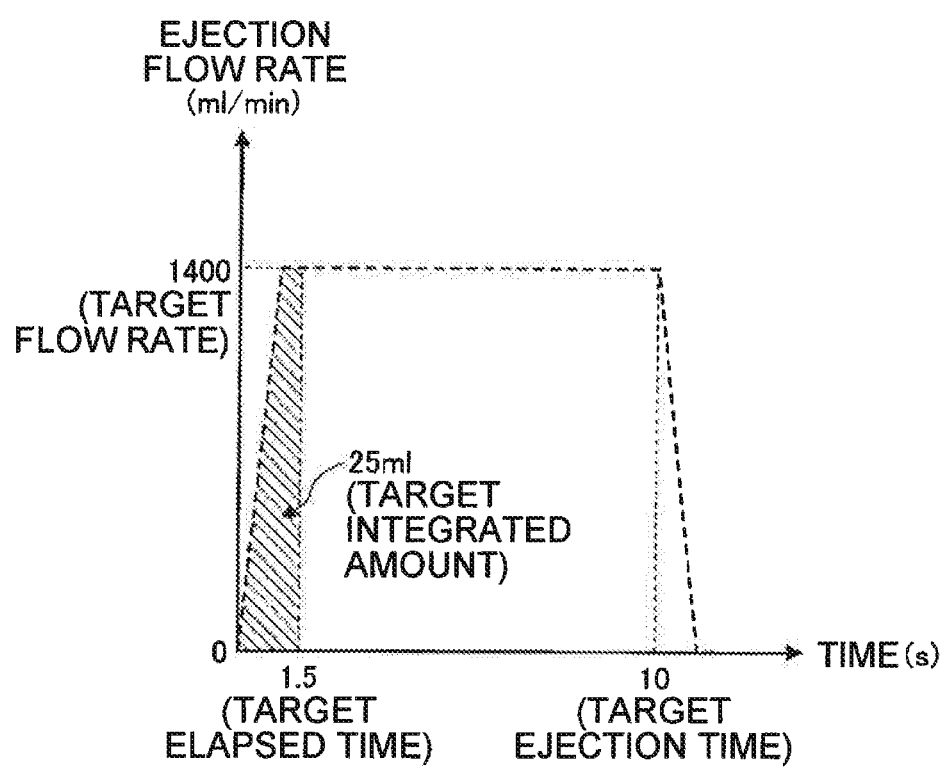
FIG. 3B is a (second) schematic explanatory view of a flow rate monitoring method according to an exemplary embodiment.
Figure 3C:
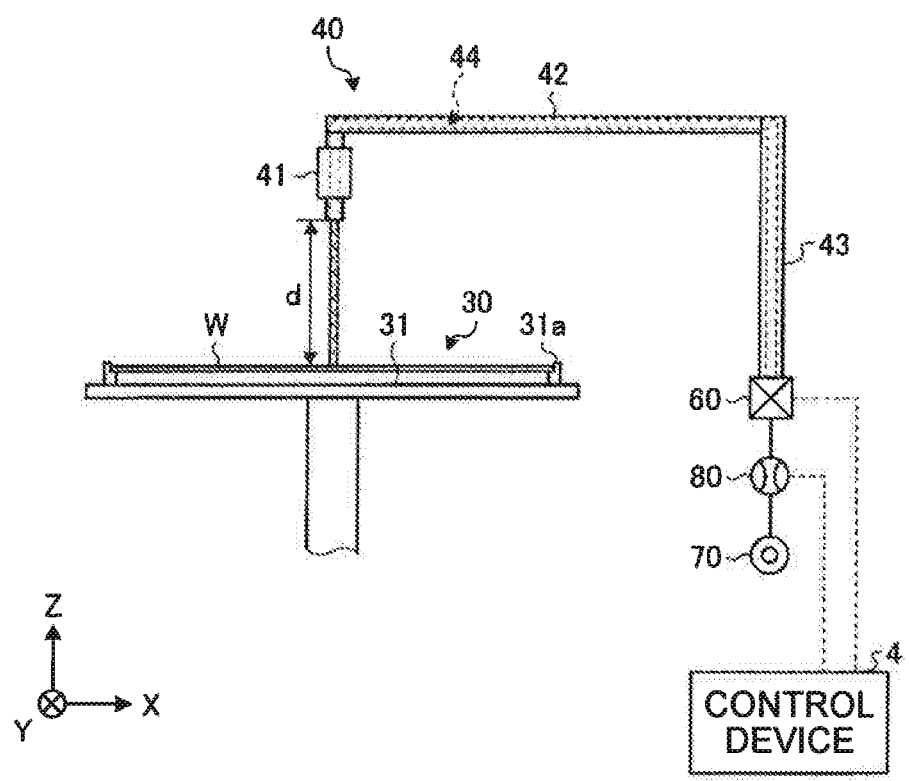
FIG. 3C is a (third) schematic explanatory view of a flow rate monitoring method according to an exemplary embodiment.

Next, an outline of a method of monitoring a flow rate of a processing fluid according to the present exemplary embodiment will be described by using FIGS. 3A to 3C. FIGS. 3A to 3C are (first to third) schematic explanatory views of a flow rate monitoring method according to an exemplary embodiment.

In addition, hereinafter, the explanation will be made with reference to a case where the processing fluid supplied by the processing fluid supply unit 40 is a processing liquid, as a primary example. Accordingly, a supply flow rate of the processing liquid supplied by the processing fluid supply unit 40 will be referred to as an "ejection flow rate."

In addition, in each of the drawings to be referred to hereinafter, a change of the ejection flow rate may be represented by a waveform, and this waveform is represented mainly in a trapezoidal waveform. However, this is merely for convenience of explanation, and is not intended to limit the actual change of the ejection flow rate.

As illustrated in FIG. 3A, the flow rate monitoring method according to the present exemplary embodiment is adapted to monitor the ejection flow rate of the processing liquid even during a time period in which the ejection flow rate exhibits a so-called transient change such as, for example, a rise and a fall, without being limited to a time period of a stable supply (see the portion surrounded by the dashed line rectangle S).

Here, the rise or the fall refers to a time transition of the ejection flow rate when the ejection flow rate is changed from a first flow rate to a second flow rate. For example, the "rise" (see the portion surrounded by the dashed line rectangle R) refers to a time transition of the ejection flow rate when the ejection flow rate is changed from "zero (0)" to a predetermined "target flow rate." The "target flow rate" corresponds to a preset "specific flow rate" which is required for a processing of the wafers W and is set in recipe information 19a to be described below. In addition, the "fall" (see the portion surrounded by the dashed line rectangle F) refers to a time transition of the ejection flow rate when the ejection flow rate is changed from the "target flow rate" to "zero (0)."

By monitoring the rise or fall, it is possible to detect an inter-device difference (so-called variation) of processing fluid supply units 40 which is caused from, for example, a machine manufacturing error or a deterioration by aging. Further, based on the result, it is possible to determine presence/non-presence of abnormality in the processing fluid supply units 40 or perform the output timing change processing to reduce the inter-device difference of the processing fluid supply units 40.

The flow rate monitoring method according to the present exemplary embodiment will be described in more detail with reference to FIGS. 3B and 3C. In addition, hereinafter, the explanation will be made with reference to a case where the "rise" is mainly monitored, as an example.

As illustrated in FIG. 3B, in the flow rate monitoring method according to the present exemplary embodiment, a target elapsed time and a target integrated amount corresponding to the target elapsed time are first preset. The target elapsed time and the target integrated amount are reference values of an elapsed time and an integrated amount from start of the ejection of the processing liquid, respectively, and become indexes for determining presence/non-presence of abnormality or detecting an inter-device difference as described above.

Specifically, the target integrated amount is set based on an amount of the processing liquid which is required until the processing liquid reaches a surface of the wafer W from the start of the ejection of the processing liquid. For example, the target integrated flow rate is set as follows. As illustrated in FIG. 3C, a processing fluid supply unit 40 includes a nozzle 41, an arm 42 that supports the nozzle 41 horizontally, and a pivoting and lifting mechanism 43 that pivots and lifts the arm 42.

A supply pipe 44 penetrates the inside of each of the nozzle 41, the arm 42, and the pivoting and lifting mechanism 43. The processing liquid is supplied to the supply pipe 44 from the processing fluid supply source 70 through a valve 60. The valve 60 corresponds to an example of the opening/closing unit, and performs opening/closing of a flow path of the processing liquid to be supplied to the nozzle 41 according to "an opening/closing operation signal" sent from the controller 18, more specifically "an opening operation signal" and "a closing operation signal." The processing liquid, which is supplied to the supply pipe 44 when the valve 60 is opened, passes through the inside of each of the pivoting and lifting mechanism 43, the arm 42, and the nozzle 41 in this order, and is ejected toward the wafer W held horizontally in a state of being slightly spaced apart from the top surface of the holding unit 31 by a holding member 31a of the holding unit 3

In addition, the target integrated amount is set based on, for example, the volume of the above-described supply pipe 44. In addition, a distance d from the tip end of the nozzle 41 to the surface of the wafer W and a diameter of the supply pipe 44 (a thickness of the processing liquid to be ejected) may be additionally taken into account. In this way, it is possible to derive the amount of the processing liquid which is required for the time until the processing liquid reaches the surface of the wafer W from the start of the ejection of the processing liquid.

Here, it is assumed that an ejection start timing of the processing liquid indicates, for example, a timing when the controller 18 outputs an ejection start signal which is a signal to instruct the start of the ejection of the processing liquid. Meanwhile, it is assumed that an ejection end timing of the processing liquid indicates a timing when the controller 18 outputs an ejection end signal which is a signal to instruct the end of the ejection of the processing liquid. The ejection start signal corresponds to an example of the "opening operation signal," and the ejection end signal corresponds to an example of the "closing operation signal."

In the flow rate monitoring method according to the present exemplary embodiment, the inter-device difference in the rise as described above is detected by monitoring a deviation between the actual elapsed time actually required by the nozzle 41 until the preset target integrated amount is reached, and the target elapsed time. Details of the monitoring of the deviation will be described later using FIG. 6A.

In addition, an actual ejection flow rate of the nozzle 41 is measured by the measuring unit 80. As illustrated in FIG. 3C, the measuring unit 80 is, for example, a flowmeter, and is provided, for example, between the processing fluid supply source 70 and the valve 60.

Returning to FIG. 3B, the flow rate monitoring method according to the present exemplary embodiment also monitors an instantaneous value of the ejection flow rate when a predetermined elapsed time, which is shorter than the target elapsed time, elapses from the start of the supply of the processing liquid. The predetermined elapsed time, which is shorter than the target elapsed time, refers to, for example, an elapsed time which slightly precedes the target elapsed time represented in FIG. 3B.

In the flow rate monitoring method according to the present exemplary embodiment, the instantaneous value of the ejection flow rate from the start of the ejection of the processing liquid is monitored so as to monitor whether the ejection flow rate normally increases to reach the target flow rate at the time of the stable supply, in other words, whether the rise of the ejection flow rate deviates from an allowable range. Details of the instantaneous value monitoring will be described later using FIG. 6B.

Figure 6A:
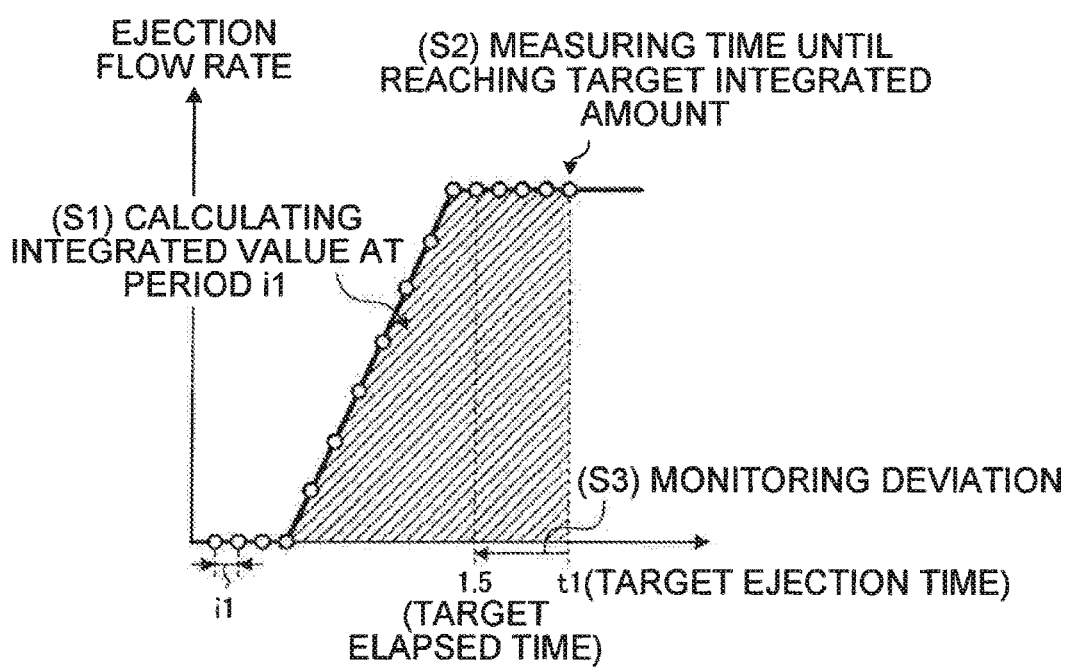
FIG. 6A is a (first) explanatory view of a case where a controller functions as a monitoring unit.
Figure 6B:
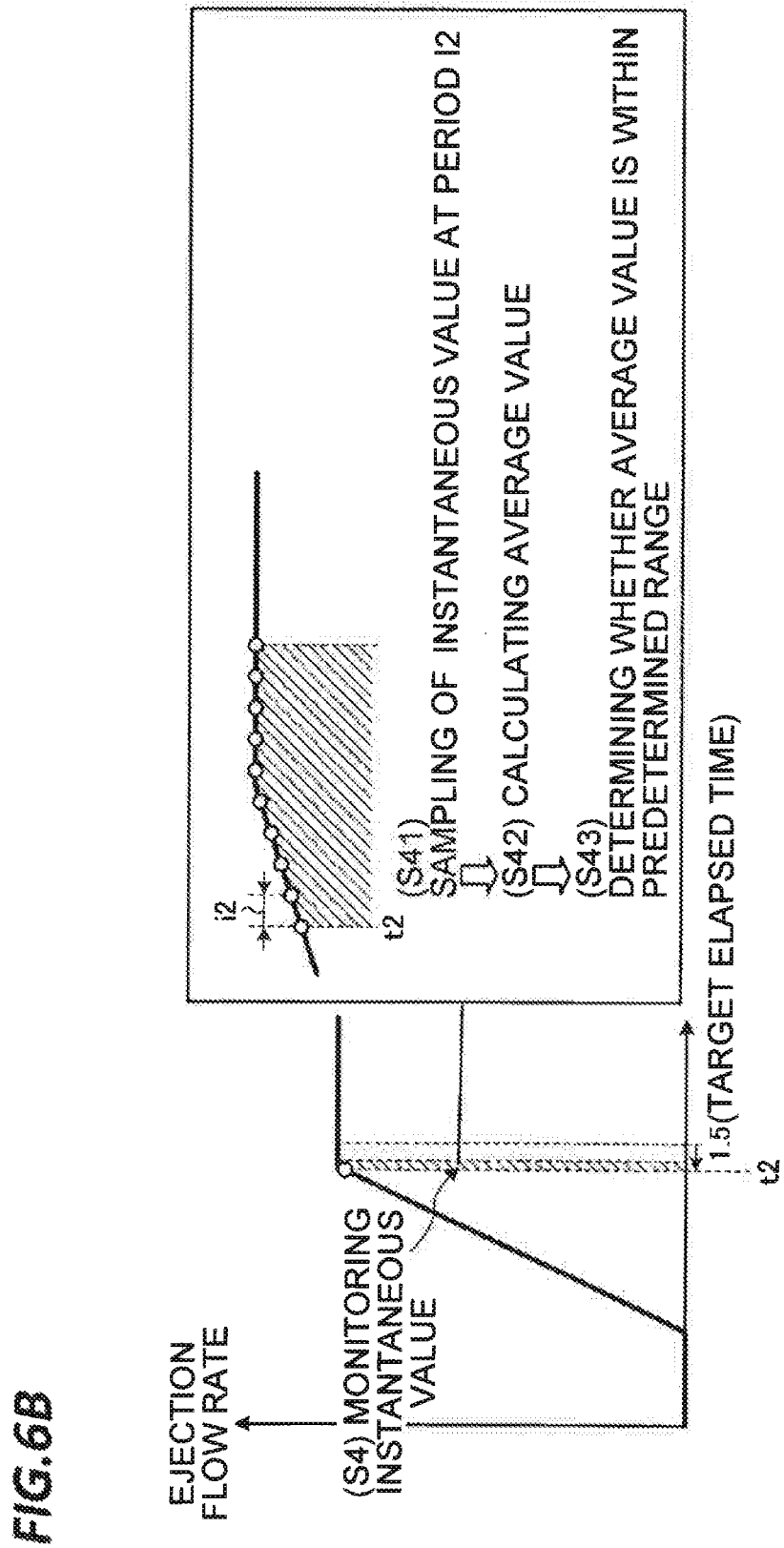
FIG. 6B is a (second) explanatory view of the case where the controller functions as the monitoring unit.

In addition, for the convenience of the subsequent descriptions, FIG. 6B represents examples of the target elapsed time, the target integrated amount, and so on. As illustrated in FIG. 3B, in the present exemplary embodiment, it is assumed that the target elapsed time is "1.5 sec," the target integrated amount is "25 mL," the target flow rate is "1,400 mL," and a target ejection time is "10 sec." The target ejection time refers to a time from the "start of ejection" to the "end of ejection." The numerical values represented in FIG. 3B are merely examples, and are not intended to limit actually set numerical values.

Figure 4:
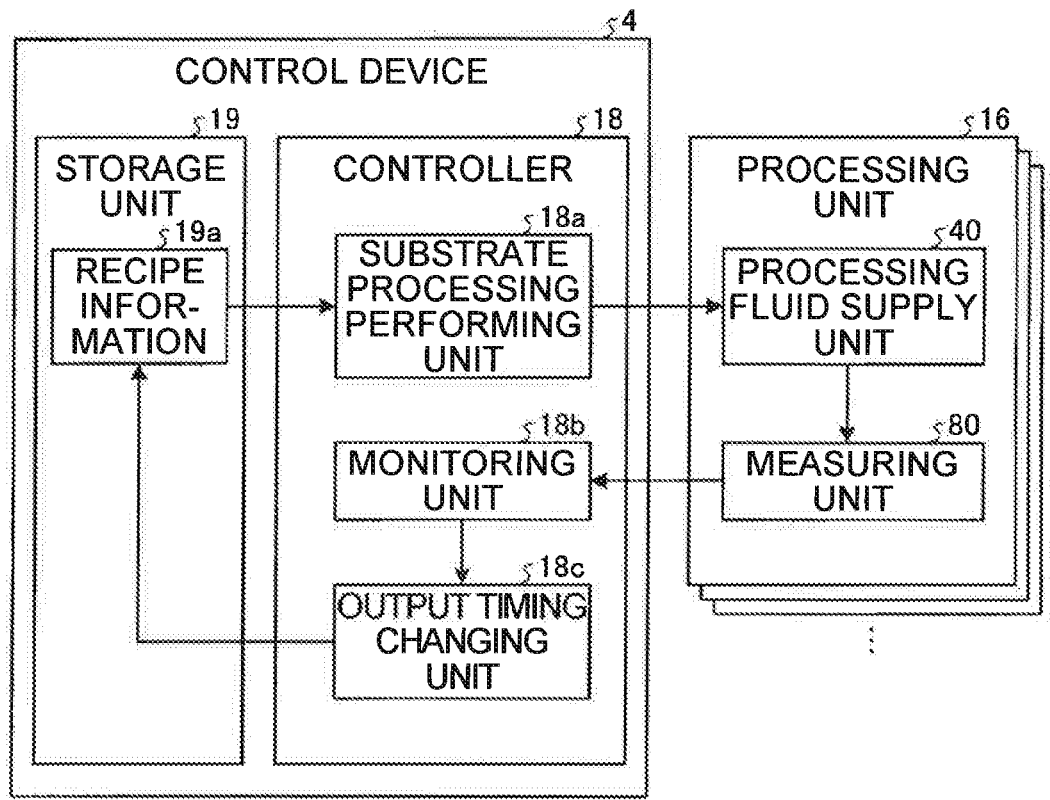
FIG. 4 is a block diagram of a control device.

Next, the control device 4 will be more specifically described with reference to FIG. 4. FIG. 4 is a block diagram of the control device 4. In FIG. 4, the components necessary to describe the features of the present exemplary embodiment are represented in functional blocks, and descriptions of general components are omitted.

In other words, each of the components illustrated in FIG. 4 is functionally conceptual, and is not necessarily required to be configured physically as illustrated therein. For example, concrete forms of distribution or integration of the individual functional blocks are not limited to those illustrated, and all or some of the functional blocks may be configured to be functionally or physically distributed or integrated in arbitrary units depending on, for example, various loads or use conditions.

In addition, all or some of the processing functions performed in the individual functional blocks of the control device 4 are implemented by a processor such as, for example, a central processing unit (CPU) and a program analyzed and executed by the processor, or by hardware using a wired logic.

First, as described above, the control device 4 includes the controller 18 and the storage unit 19 (see FIG. 1). The controller 18 is, for example, a CPU, and reads and executes a program (not illustrated) stored in the storage unit 19 so as to function as, for example, each of the functional blocks 18a to 18c illustrated in FIG. 4. Subsequently, the individual functional blocks 18a to 18c will be described.

As illustrated in FIG. 4, the controller 18 includes, for example, a substrate processing performing unit 18a, a monitoring unit 18b, and an output timing changing unit 18c. The storage unit 19 stores recipe information 19a therein.

When the controller 18 functions as the substrate processing performing unit 18a, the controller 18 controls the processing unit 16 according to the recipe information 19a stored in the storage unit 19 to perform a series of substrate processings including a chemical liquid processing that supplies a chemical liquid to the wafer W, a rinse processing that supplies a rinse liquid to the wafer W, and a dry processing that dries the wafer W.

In this case, according to the recipe information 19a, the controller 18 sends, to the valve 60 of the processing fluid supply unit 40, an opening/closing operation signal to cause the valve 60 to perform an opening/closing operation, specifically, an opening operation signal to cause the valve 60 to perform an opening operation and a closing operation signal to cause the valve 60 to perform a closing operation, and causes the processing fluid supply unit 40 to eject a predetermined processing liquid depending on the substrate processing contents. The ejection flow rate by the processing fluid supply unit 40 is measured by the measuring unit 80, and the measurement result is notified to the monitoring unit 18b whenever the measurement is performed.

The recipe information 19a is information that indicates the substrate processing contents. Specifically, the recipe information 19a is information in which the respective processing contents to be executed by the processing unit 16 during the substrate processings are registered in advance in a processing sequence. Here, the respective processing contents also include, for example, a type of a processing liquid to be ejected by the processing fluid supply unit 40 depending on the substrate processing contents. In addition, the recipe information 19a includes information about the timing of outputting the opening operation signal and the closing operation signal to the valve 60. The controller 18 outputs the opening operation signal and the closing operation signal at the timing preset by the recipe information 19a. Here, the preset timing refers to a timing of outputting the opening operation signal and the closing operation signal which is currently stored in the recipe information 19a. That is, when the timing of outputting the opening operation signal or the closing operation signal is changed by the output timing change processing to be described later, the changed timing of outputting the opening operation signal or the closing operation signal becomes the preset timing from the position of a wafer W to be processed after the change.

Figure 5:
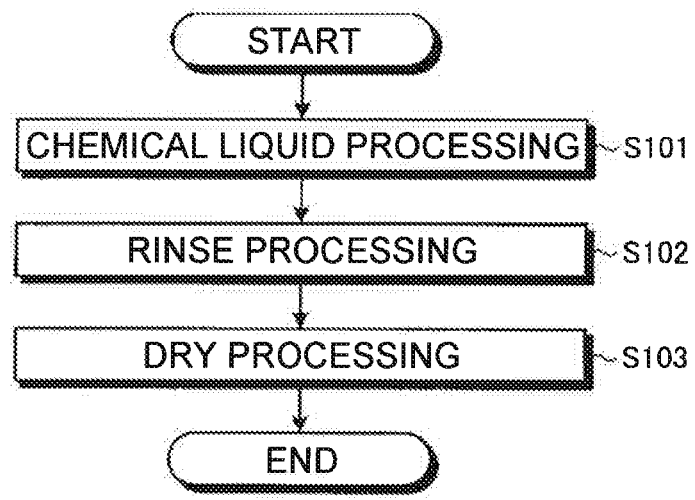
FIG. 5 is a flow chart illustrating a processing sequence of a series of substrate processings performed in a processing unit.

Here, the processing sequence of the series of substrate processings which are controlled by the controller 18 and performed in the processing unit 16 will be described with reference to FIG. 5. FIG. 5 is a flow chart illustrating a sequence of a series of substrate processings performed in the processing unit 16.

As illustrated in FIG. 5, in the processing unit 16, the chemical liquid processing (step S101), the rinse processing (step S102), and the dry processing (step S103) are performed in this order.

In the chemical liquid processing, dilute hydrofluoric acid (DHF) is ejected from the nozzle 41 toward the wafer W. In the rinse processing, deionized water (DIW) is ejected from the nozzle 41 toward the wafer W so that DHF on the wafer W is washed away. In the dry processing, DIW on the wafer W is removed so that the wafer W is dried.

In addition, each of the processing liquids, i.e., DHF or DIW is stored in the separate processing fluid supply source 70, and ejected from the nozzle 41 by opening/closing of the separate valve 60. Although not illustrated in FIG. 5, a processing of replacing the wafer W within the chamber 20 is performed after the dry processing is ended.

Here, when the time from the timing when, for example, DHF reaches the wafer W until the DHF no longer reaches the wafer W is different depending on the processing units 16, a variation occurs in an etching amount among wafers W. Thus, the control device 4 performs the output timing change processing to be described later so as to make constant the time from the timing when the DHF reaches the wafer W until the DHF no longer reaches the wafer W, thereby suppressing a variation in an etching amount among wafers W.

Returning to FIG. 4, next, a case where the controller 18 functions as the monitoring unit 18b will be described. When functioning as the monitoring unit 18b, the controller 18 monitors at least the rise of the ejection flow rate based on the measurement result of the measuring unit 80. Specifically, after sending the opening/closing operation signal to the valve 60 of the processing fluid supply unit 40 according to the recipe information 19a, the controller 18 starts integration of the supply flow rate based on the measurement result of the measuring unit 80, and monitors the rise of the supply flow rate with the calculated integrated amount. In addition, at the time of specific flow rate supply, the controller 18 monitors the supply flow rate with the value actually measured by the measuring unit 80. In addition, the controller 18 determines presence/non-presence of abnormality in the processing fluid supply unit 40 based on the monitoring result. In addition, the controller 18 performs such monitoring processing and determination processing on all the processing units 16.

The case where the controller 18 functions as the monitoring unit 18b will be described in more detail with reference to FIGS. 6A and 6B. FIGS. 6A and 6B are (first and second) explanatory views of the case where the controller 18 functions as the monitoring unit 18b. In FIG. 6A, an "integrated value" corresponds to the integrated amount calculated by the controller 18.

As illustrated in FIG. 6A, when the controller 18 functions as the monitoring unit 18b, as an example, the controller 18 calculates an integrated value of the ejection flow rate of the processing liquid in a predetermined period i1 from the start of the ejection (step S1). The period it may be, for example, about 10 msec to about 100 msec.

Then, the controller 18 measures a time required until the integrated value of step S1 reaches the predetermined target integrated amount (step S2). In addition, here, the time until the integrated value reaches the target integrated amount is referred to as an actual elapsed time t1.

Then, the controller 18 monitors a deviation between the measured actual elapsed time t1 and the target elapsed time (step S3), and determines presence/non-presence of abnormality in the processing fluid supply unit 40 based on the monitoring result.

For example, when the deviation in the time of reaching the target integrated amount as described above is within a predetermined range which indicates an allowable range that may be regulated by the output timing change processing to be described later, the controller 18 makes a normality determination which means that no abnormality exists, and notifies the output timing changing unit 18c of the detected deviation of the processing fluid supply unit 40 of each processing unit 16.

In addition, when the deviation is not within the predetermined range, the controller 18 makes an abnormality determination which means that abnormality exists, and performs a predetermined processing to be performed at the time of making an abnormality determination (e.g., outputting an alarm to an output device such as, for example, a display unit or stopping the substrate processing).

In addition, as another example of monitoring the deviation, the controller 18 may calculate an integrated value of the ejection flow rate of the processing fluid in a predetermined target elapsed time, and monitor a deviation between the integrated value and the predetermined target integrated amount. Even with such a case, the presence/non-presence of abnormality in the processing fluid supply unit 40 may be determined depending on a degree of the deviation.

In addition, without being limited to the monitoring of the deviation based on the integrated value of the ejection flow rate as illustrated in FIG. 6A, the controller 18 further monitors an instantaneous value of the ejection flow rate when a predetermined elapsed time which is shorter than the target elapsed time is elapsed from the supply start of the processing liquid (step S4) as illustrated in FIG. 6B. Here, a time t2 is referred to as the predetermined elapsed time.

Specifically, as illustrated in FIG. 6B, the controller 18 samples the instantaneous value of the ejection flow rate plural times at a predetermined period i2 from the time t2 (step S41). The period i2 may be, for example, about 10 msec to about 50 msec.

Then, the controller 18 calculates an average value of the instantaneous values obtained from the sampling (step S42), and determines whether the calculated average value is within a predetermined range, for example, based on the target flow rate (step S43). By acquiring the average value of the instantaneous values, a steep variation of the ejection flow rate may be smoothed so that it is possible to make an insensitive and gradual abnormality determination.

For example, it is assumed that the predetermined elapsed time is 1 sec, and the predetermined range based on the target flow rate (1,400 mL) is ±1% of the target flow rate. In this case, when the average value of the instantaneous values sampled after 1 sec from the start of the ejection is within a range of 1,386 mL to 1,414 mL, the controller 18 determines it as normal which means that no abnormality exists in the processing fluid supply unit 40, and causes a series of substrate processings to be continued.

In addition, when the average value of the sampled instantaneous values is not within the range, the controller 18 executes a predetermined processing in determining the abnormality as described above.

Returning to FIG. 4, next, a case where the controller 18 functions as the output timing changing unit 18c will be described. When functioning as the output timing changing unit 18c, the controller 18 performs the output timing change processing to change the timing of outputting the ejection start signal to the valve 60 based on the integrated amount calculated based on the measurement result of the measuring unit 80.

More specifically, when functioning as the output timing changing unit 18c, the controller 18 changes the timing of outputting the ejection start signal to the valve 60 based on the deviation of each processing fluid supply unit 40 that has been notified from the monitoring unit 16*b*, so as to make constant the timing when a predetermined processing liquid for a predetermined substrate processing reaches the surface of the wafer W (hereinafter, referred to as a "reaching timing") among nozzles 41. As a result, the time from the timing when the processing liquid reaches the wafer W until the processing liquid no longer reaches the wafer W becomes constant among the nozzles 41. Accordingly, when the output timing change processing is applied to a process of supplying, for example, DHF as a processing liquid, a variation in an etching amount among wafers W may be suppressed. In addition, in the present exemplary embodiment, a timing T4 of outputting the ejection end signal is not changed. The output timing change processing is performed, for example, when a variation in the processing units 16 is regulated at the time of the initial setting of the substrate processing system 1. The output timing change processing is also performed during the performance of the series of substrate processings on the wafer W as a product substrate after the initial setting. In this case, the output timing change processing is performed at each preset interval. This interval may be set based on, for example, a lot which is a transfer unit of wafers W or the number of wafers W to be processed.

In addition, the output timing changing unit 18*c* changes the recipe information 19*a* based on the changed timing of outputting the ejection start signal, thereby causing the substrate processing performing unit 18*a* to control each processing fluid supply unit 40 at the changed timing of outputting the ejection start signal.

The case where the controller 18 functions as the output timing changing unit 18*c* will be more specifically described with reference to FIGS. 7A to 7D. FIGS. 7A to 7D are (first to fourth) explanatory views of the case where the controller 18 functions as the output timing changing unit 18*c*.

With respect to FIGS. 7A to 7D, the descriptions will be made with reference to two processing units 16 (i.e., a "first processing unit 16_1" and a "second processing unit 16_2"), as an example, while comparing the first and second processing units with each other.

In addition, the reference numerals "_1" and "_2" will also be added to the symbols of the components of each of the "first processing unit 16_1" and the "second processing unit 16_2" (e.g., nozzles 41) for discrimination of the components. In addition, the dashed line rectangular waveforms represented in FIGS. 7A to 7D are waveforms of the ejection signal.

Figure 7A:
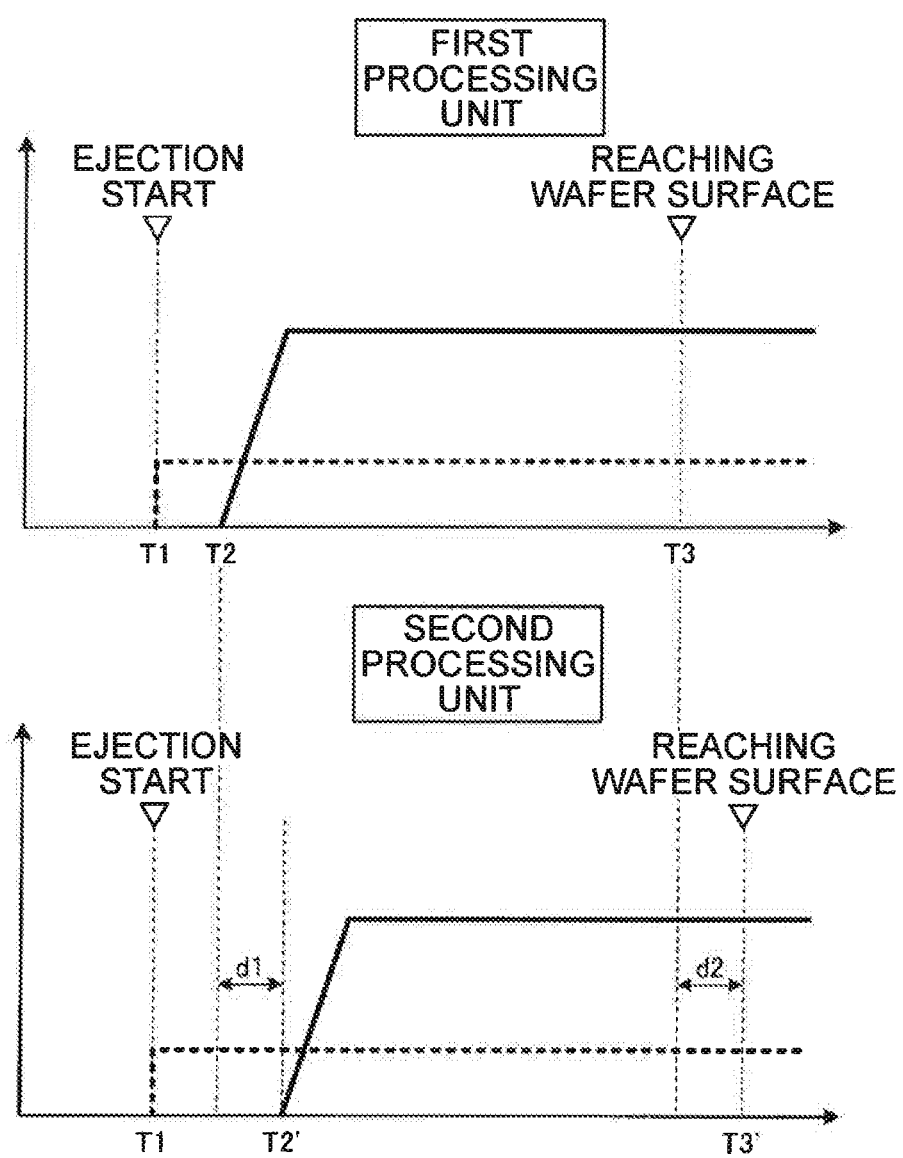
FIG. 7A is a (first) explanatory view of a case where a controller functions as an output timing changing unit.

First, it is assumed that the controller 18 functions as the monitoring unit 18*b* so that the monitoring result represented in FIG. 7A is obtained. As illustrated in FIG. 7A, in the first processing unit 16_1, the ejection of the processing liquid is started at a timing T1 of outputting the ejection start signal such that the ejection flow rate of the processing liquid begins to rise zero (0) or more from a timing T2, and thereafter, a timing T3 is the reaching timing when the processing liquid reaches the surface of the wafer W.

In the second processing unit 16_2, it is assumed that as in the first processing unit 16_1, the ejection of the processing liquid is started at a timing T1 of outputting the ejection start signal such that the ejection flow rate begins to rise zero (0) or more from a timing T2' which is later than the timing T2, and thereafter, a timing T3' which is later than the timing T3 is the reaching timing.

That is, a relative deviation d1 with respect to the start of the rise and a relative deviation d2 with respect to the reaching timing occur between the processing unit 16_1 and the second processing unit 16_2. Here, for the convenience of explanation, it is assumed that d1=d2.

When the controller 18 functions as the output timing changing unit 18*c*, based on the monitoring result, the controller 18 determines, for example, the nozzle 41 exhibiting the latest reaching timing as a reference (corresponding to an example of the "reference nozzle") and delays the timing of outputting the ejection start signal to each of the other nozzles 41 based on the above-described deviation so as to make the reaching timing of each of the other nozzles 41 conform to the reaching timing of the reference nozzle 41.

Figure 7B:
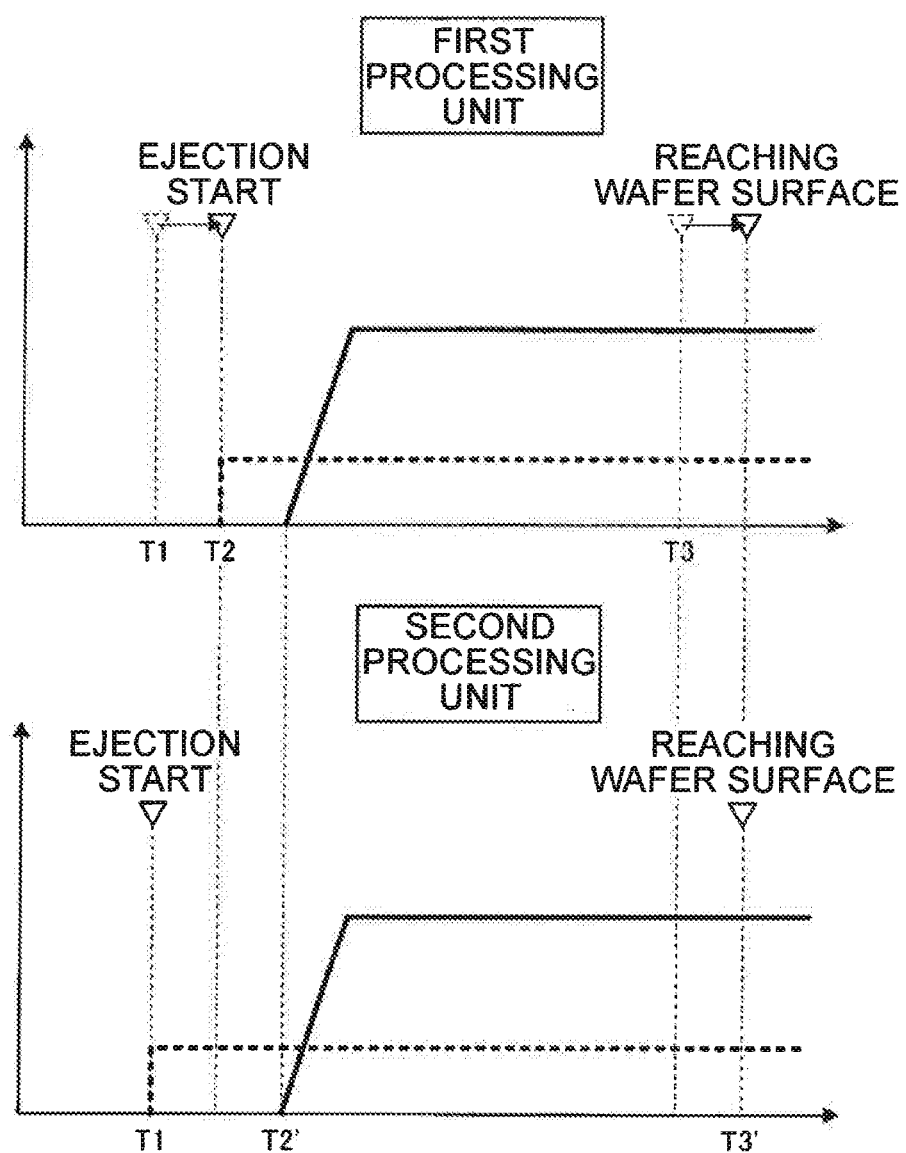
FIG. 7B is a (second) explanatory view of the case where the controller functions as the output timing changing unit.

Specifically, when the monitoring result represented in FIG. 7A is obtained, the controller 18 determines the nozzle 41_2 of the second processing unit 16_2 exhibiting the latest reaching timing as a reference nozzle as illustrated in, for example, FIG. 7B.

Then, the controller 18 delays the timing of outputting the ejection start signal to the first processing unit 16_1 side which has been the timing T1 to the timing T2' based on the above-described deviation d1 so as to make the reaching timing T3 of the nozzle 41_1 of the first processing unit 16_1 conform to the reaching timing T3' of the reference nozzle.

In this way, the reaching timing of the processing fluid may be made constant between the first processing unit 16_1 and the second processing unit 16_2, so that a variation of a processing result caused by a variation of the reaching timing between wafers W, for example, a variation of an etching amount between wafers W may be suppressed. Further, a decrease of a yield resulting from the variation of the processing result may be suppressed.

In addition, when the number of the processing units 16 is three or more, the nozzle 41 exhibiting the latest reaching timing among the nozzles 41 of the processing units 16 may be determined as a reference nozzle, and the timing of outputting the ejection start signal to each of all the other nozzles 41 may be delayed according to a deviation of each of the other nozzles 41 so as to make the reaching timing of each of the other nozzles 41 conform to the reaching timing of the reference nozzle.

Figure 7C:
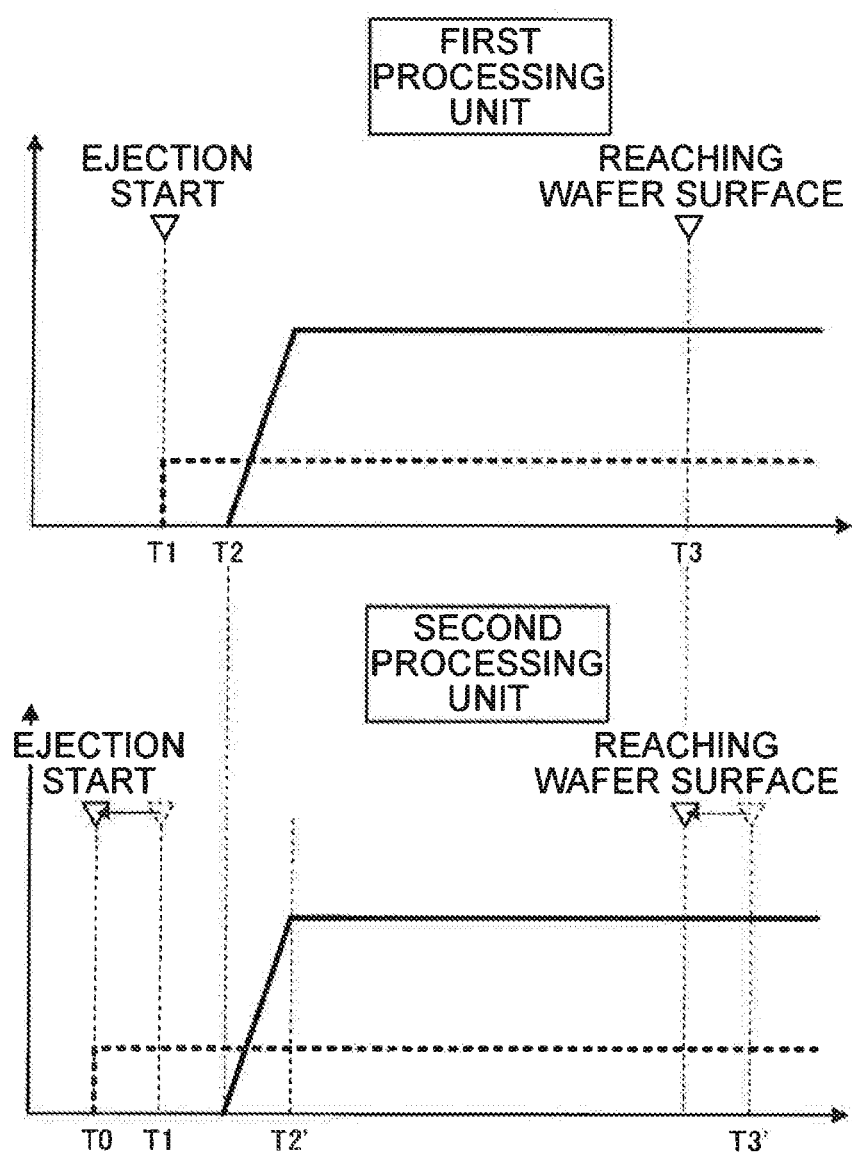
FIG. 7C is a (third) explanatory view of the case where the controller functions as the output timing changing unit.

FIG. 7B represents the example where the timing of outputting the ejection start signal is delayed, but reversely, the timing of outputting the ejection start signal may be advanced. That is, a nozzle 41 exhibiting the earliest reaching timing may be determined to be a reference nozzle as described above, and the timing of outputting the ejection start signal to each of the other nozzles 41 may be advanced based on the above-described deviation so as to make the reaching timing of each of the other nozzles 41 conform to the reaching timing of the reference nozzle. FIG. 7C represents this example.

Specifically, when the monitoring result represented in FIG. 7A is obtained, the controller 18 determines the nozzle 41_1 of the first processing unit 16_1 exhibiting the earliest reaching timing to be a reference nozzle as illustrated in, for example, FIG. 7C.

Then, the controller 18 advances the timing of outputting the ejection start signal to the second processing unit 16_2 side which has been the timing T1 to the timing T0 based on the above-described relative deviation d1 so as to make the reaching timing T3' of the nozzle 41_2 of the processing unit 16_2 conform to the reaching timing T3 of the reference nozzle.

In this case as well, the reaching timing of the processing liquid may be made constant between the first processing unit 16_1 and the second processing unit 16_2, so that a variation of a processing result caused by a variation of the reaching timing between wafers W, for example, a variation of an etching amount between wafers W may be suppressed. Further, a decrease of a yield resulting from the variation of the processing result may be suppressed.

In addition, when the number of the processing units 16 is three or more, the nozzle 41 exhibiting the earliest reaching timing among the nozzles of the processing units 16 may be determined as a reference nozzle, and the timing of outputting the ejection start signal to each of all the other nozzles 41 may be advanced according to a deviation of each of the other nozzles 41 so as to make the reaching timing of each of the other nozzles 41 conform to the reaching timing of the reference nozzle.

Figure 7D:
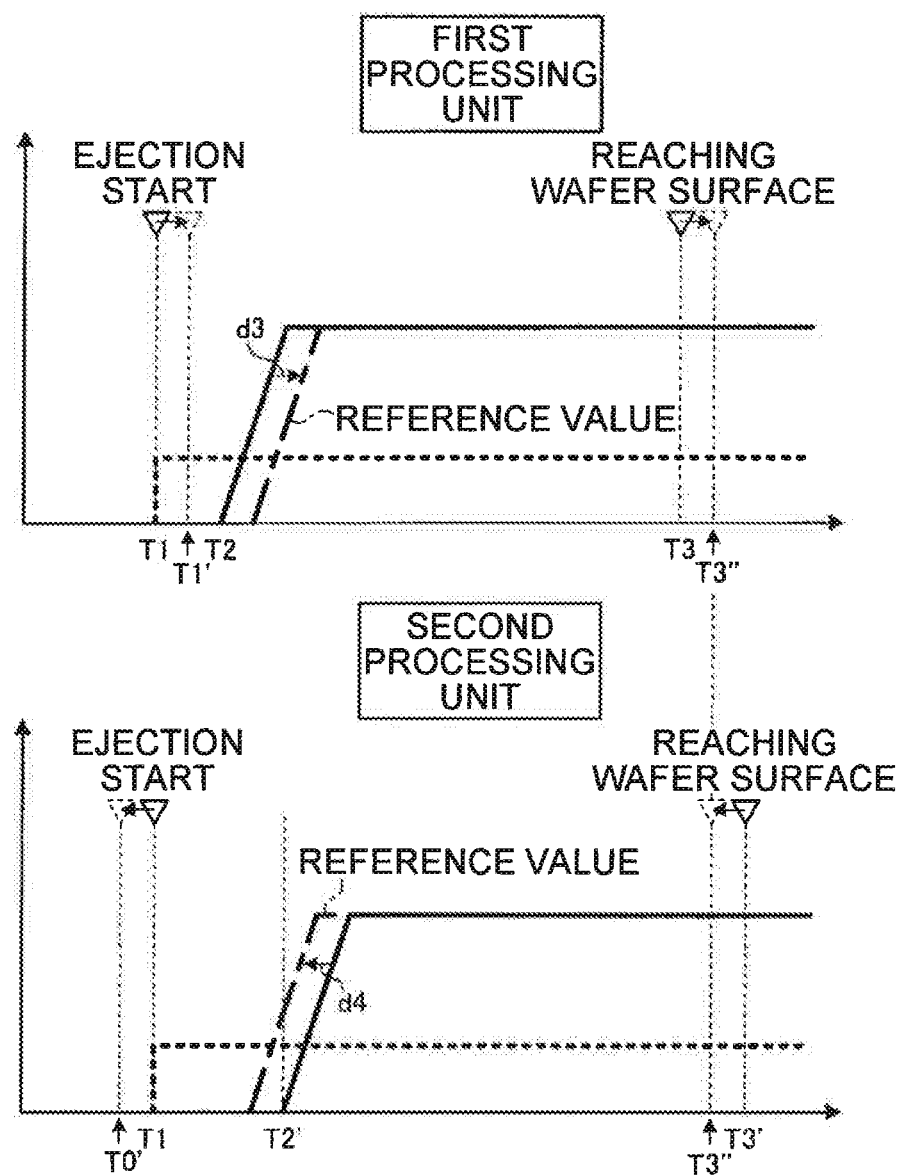
FIG. 7D is a (fourth) explanatory view of the case where the controller functions as the output timing changing unit.

In addition, FIGS. 7B and 7C represent the example where the nozzle 41 exhibiting the latest or earliest reaching timing in the monitoring result is determined as a reference nozzle, and the reaching timing of each of the other nozzles is made to conform to the reaching timing of the reference nozzle. However, the timing control may be performed to conform to a reference value preset as a target value. FIG. 7D represents this example. For convenience of explanation, in FIG. 7D, a preset reference value is represented by a long and short dashed line waveform. In the reference value, the reaching timing is a timing T3".

Specifically, when the monitoring result represented by FIG. 7A is obtained, the controller 18 performs the timing control such that the reaching timings of both the nozzles 41 conform to the reaching timing T3" of the preset reference value, as illustrated in, for example, FIG. 7D.

For example, as illustrated in FIG. 7D, it is assumed that a relatively preceding deviation d3 from the reference value occurs in the first processing unit 16_1. In this case, the controller 18 delays the timing of outputting the ejection start signal to the first processing unit 16_1 which has been the timing T1 to the timing T1' based on the deviation d3 from the reference value so as to make the reaching timing T3 of the nozzle 41_1 of the first processing unit 16_1 conform to the reaching timing T3" of the reference value.

In addition, for example, it is assumed that a relative delayed deviation d4 from the reference value occurs in the second processing unit 16_2. In this case, the controller 18 advances the timing of outputting the ejection start signal to the second processing unit 16_2 which has been the timing T1 to the timing T0' based on the deviation d4 from the reference value so as to make the reaching timing T3' of the nozzle 41_2 of the second processing unit 16_2 to the reaching timing T3" of the reference value.

In this case as well, the reaching timing of the processing liquid may be made constant between the first processing unit 16_1 and the second processing unit 16_2, so that a variation of a processing result caused by a variation of the reaching timing between wafers W, for example, a variation of an etching amount between wafers W may be suppressed. Further, a decrease of a yield resulting from the variation of the processing result may be suppressed.

In addition, when the number of the processing units 16 is three or more, the timing of outputting the ejection start signal to each of the nozzles 41 may be delayed or advanced according to a deviation of each of the nozzles 41 from the reference value so as to make the reaching timing of each of the nozzles 41 conform to the reaching timing of the reference value.

Next, descriptions will be made on a processing sequence of processings performed when the controller 18 functions as the monitoring unit 18b and the output timing changing unit 18c with reference to FIGS. 8A to 8C.

Figure 8A:
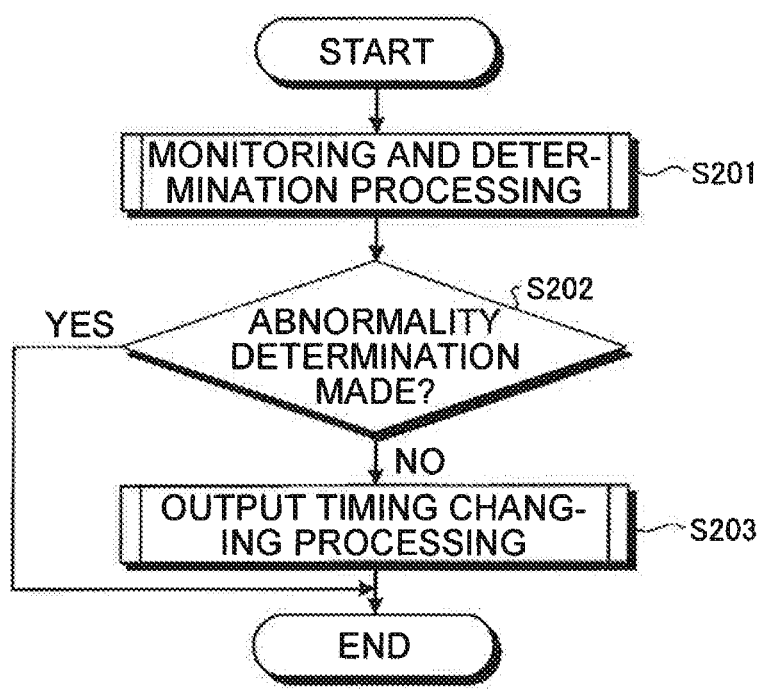
FIG. 8A is a flow chart illustrating a processing sequence of processings performed when the controller functions as the monitoring unit and the output timing changing unit.
Figure 8B:
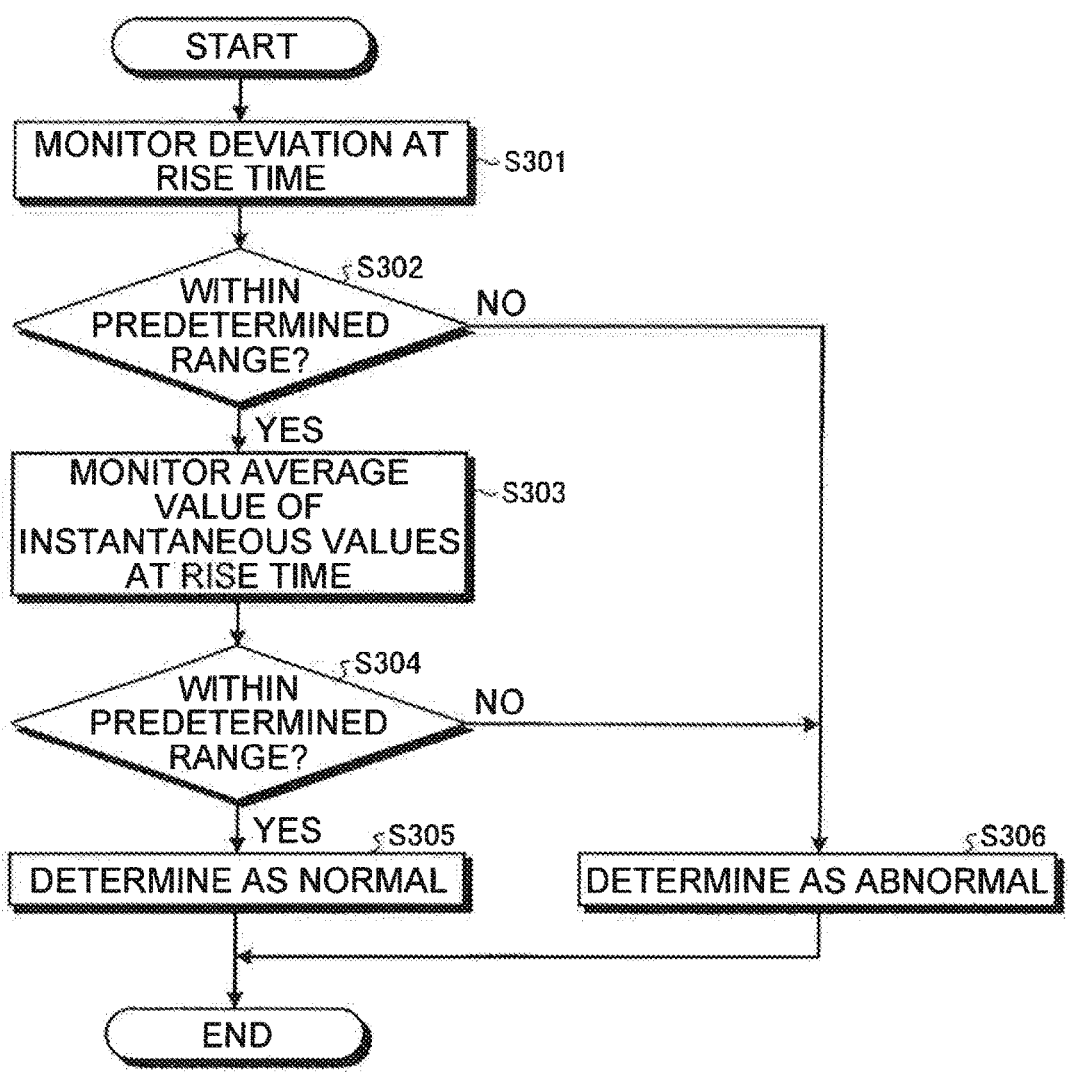
FIG. 8B is a flow chart illustrating a processing sequence of a monitoring and determination processing performed when the controller functions as the monitoring unit.
Figure 8C:
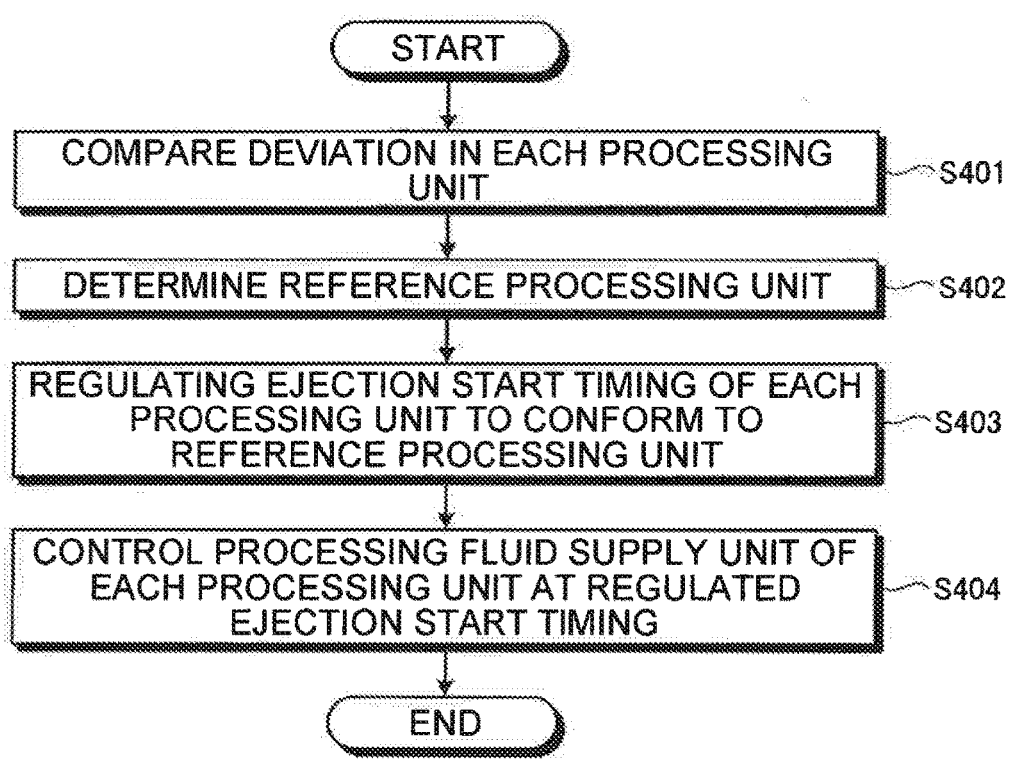
FIG. 8C is a flow chart illustrating a processing sequence of an output timing change processing performed when the controller functions as the output timing changing unit.

FIG. 8A is a flow chart illustrating a processing sequence of processings performed when the controller 18 functions as the monitoring unit 18b and the output timing changing unit 18c. FIG. 8B is a flow chart illustrating a processing sequence of a monitoring and determination processing performed when the controller 18 functions as the monitoring unit 18b. FIG. 8C is a flow chart illustrating a processing sequence of an output timing change processing performed when the controller 18 functions as the output timing changing unit 18c.

As illustrated in FIG. 8A, the controller 18 functions as the monitoring unit 18b to perform the monitoring and determination processing (step S201). When an abnormality determination is not made in the monitoring and determination processing (No in step S202), the controller 18 functions as the output timing changing unit 18c so as to perform the output timing change processing (step S203).

When an abnormality determination is made in the monitoring and determination processing (Yes in step S202), the controller 18 ends the processing without performing the output timing change processing.

Here, the processing sequence represented in FIG. 8A may be repeatedly performed whenever the ejection of the processing liquid from a nozzle 41 is performed during the performance of the series of substrate processings of the substrate processing system 1 in the actual operation thereof. That is, the output timing change processing may be repeatedly performed based on the monitoring result obtained whenever the ejection of the processing liquid from a nozzle 41 is performed, and the control result may be sequentially and dynamically changed. For example, a result obtained from performing the output timing change processing based on a monitoring result for a wafer W processed this time with supply of DHF thereto may be applied when DHF is supplied to the next wafer W.

As a result, it is possible to perform the monitoring and determination and the timing control in response to a dynamic change of the deviation, for example, during the actual operation.

Next, the processing sequence of the monitoring and determination processing will be described. As illustrated in FIG. 8B, in the monitoring and determination processing, the controller 18 monitors a deviation at the time of the rise of the ejection flow rate (step S301). The deviation is based on the integrated value of the ejection flow rate as described above.

Then, the controller 18 determines whether the deviation is within a predetermined range indicating an allowable range (step S302). Here, when it is determined that the deviation is within the predetermined range (Yes of step S302), the controller 18 monitors an average value of instantaneous values at the time of the rise of the ejection flow rate (step S303).

Then, the controller 18 determines whether the average value is within a predetermined range based on the target flow rate (step S304).

Here, when it is determined that the average value is within the predetermined range (Yes of step S304), the controller 18 makes a normality determination which means that no abnormality exists in the processing fluid supply unit 40 (step S305), and ends the processing.

Meanwhile, when it is determined that the above-described deviation or average value is not within the predetermined range (No of step S302/No of step S304), the controller 18 makes an abnormality determination which means that abnormality exists in the processing fluid supply unit 40 (step S306), and ends the processing.

Next, the processing sequence of the output timing change processing will be described. As described in FIG.

8C, in the output timing change processing, the controller 18 compares deviations of the respective processing units 16 with each other based the monitoring result obtained in the monitoring and determination processing (step S401).

Thereafter, the controller 18 determines a processing unit 16 (a nozzle 41 thereof) which becomes a reference in the output timing change processing (step S402).

Then, the controller 18 changes the ejection start timing of each of the processing units 16 to conform to the processing unit 16 determined by the controller 18 as a reference (step S403). The ejection start timing corresponds to the timing of outputting the ejection start signal as described above.

Then, the controller 18 changes the recipe information 19a based on the changed ejection start timing, controls the processing fluid supply unit 40 of each of the processing units 16 according to the changed recipe information 19a (step S404), and ends the processing. In addition, the changed recipe information 19a is applied when the processing fluid is supplied to the next wafer W.

As described above, the substrate processing system 1 (corresponding to an example of the "processing apparatus") according to the present exemplary embodiment includes the chamber 20, at least one nozzle 41, the measuring unit 80, the valve 60 (corresponding to an example of the "opening/closing unit"), and the controller 18.

The chamber 20 accommodates a wafer W (corresponding to an example of the "workpiece") therein. The nozzle 41 is provided in the chamber 20 to supply a processing liquid (corresponding to an example of the "processing fluid") toward the wafer W. The measuring unit 80 measures an ejection flow rate (corresponding to an example of the "supply flow rate") of the processing liquid supplied to the nozzle 41. The valve 60 performs opening/closing of a flow path of the processing liquid to be supplied to the nozzle 41. The controller 18 outputs an ejection start signal (corresponding to an example of the "opening operation signal") to cause the valve 60 to perform an opening operation and an ejection end signal (corresponding to an example of the "closing operation signal") to cause the valve 60 to perform a closing operation, at a preset timing.

In addition, after outputting the ejection start signal, the controller 18 calculates an integrated amount of the processing liquid based on the measurement result of the measuring unit 80 obtained when the supply flow rate changes into a preset flow rate, and performs the output timing change processing to change the timing of outputting the ejection start signal from the preset timing based on the calculated integrated amount.

Thus, according to the substrate processing system 1 of the present exemplary embodiment, a variation of a processing result caused by a variation in workpieces with respect to the time from reaching of the processing liquid to a workpiece to non-reaching thereto, e.g., a variation of an amount of etching by DHF may be suppressed.

Second Exemplary Embodiment

Figure 9:
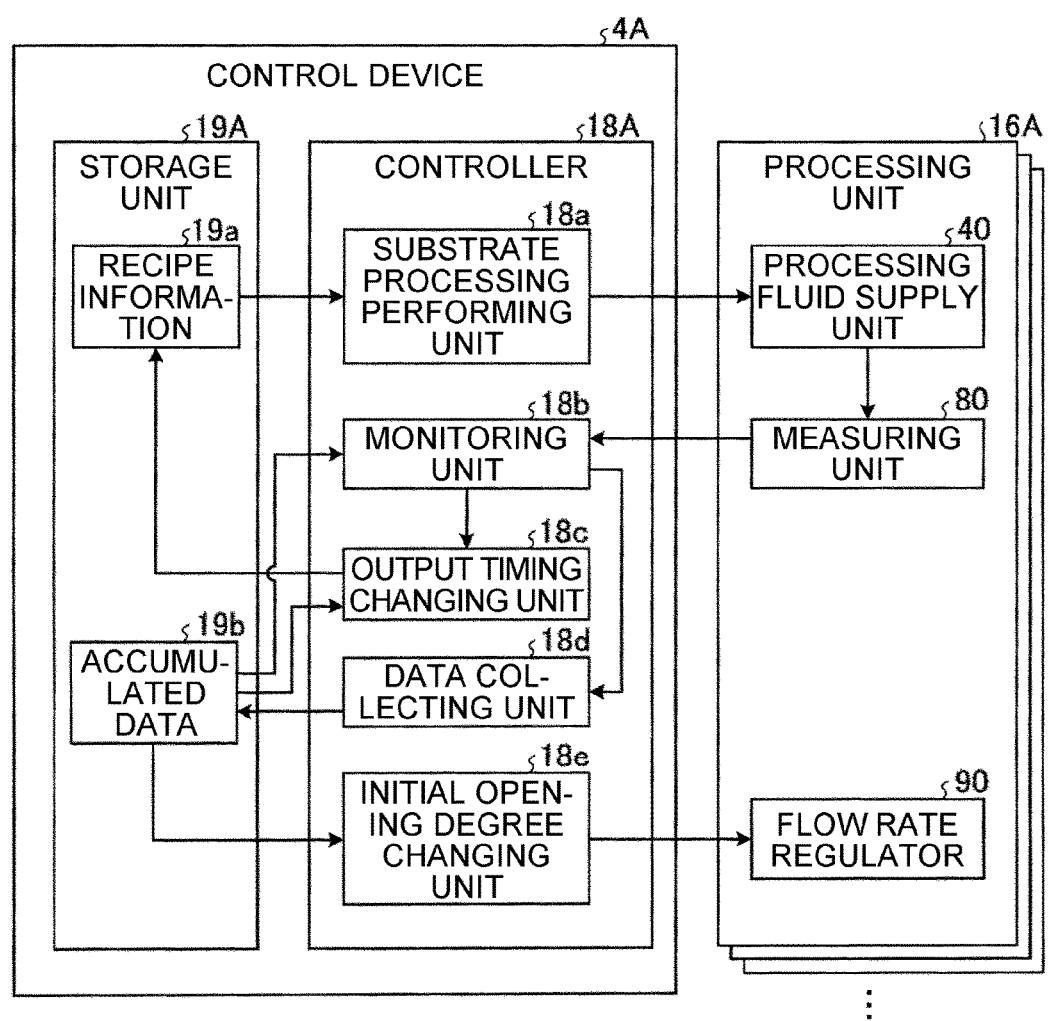
FIG. 9 is a block diagram of a control device according to a second exemplary embodiment.
Figure 10:
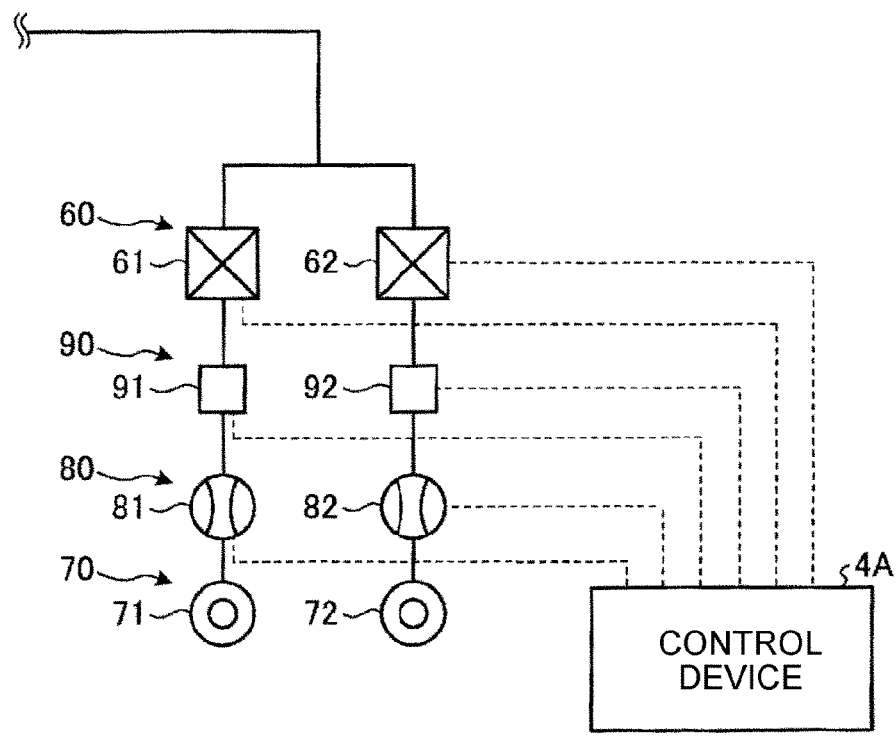
FIG. 10 is a view illustrating a configuration of a processing unit according to the second exemplary embodiment.

Next, a substrate processing system according to a second exemplary embodiment will be described. FIG. 9 is a block diagram of a control device according to the second exemplary embodiment. FIG. 10 is a view illustrating a configuration of a processing unit according to the second exemplary embodiment.

As illustrated in FIG. 9, a control device 4A according to the second exemplary embodiment includes a controller 18a and a storage unit 19A. The controller 18A includes a substrate processing performing unit 18a, a monitoring unit 18b, an output timing changing unit 18c, a data collecting unit 18d, and an initial opening degree changing unit 18e. The storage unit 19A stores recipe information 19a and accumulated data 19b therein.

In addition, as illustrated in FIG. 9, the processing unit 16A according to the second exemplary embodiment includes a processing fluid supply unit 40, a measuring unit 80, and a flow rate regulator 90. Specifically, as illustrated in FIG. 10, the processing unit 16A includes a DHF supply source 71 which is a supply source of DHF and a DIW supply source 72 which is a supply source of DIW, as a processing fluid supply source 70. The valve 60 includes a first valve 61 provided at a downstream side of the DHF supply source 71 to open and close a flow path of DHF and a second valve 62 provided at a downstream side of the DIW supply source 72 to open and close a flow path of DIW. In addition, the measuring unit 80 includes a first measuring unit 81 provided in a flow path between the DHF supply source 71 and the first valve 61 to measure a flow rate of DHF, and a second measuring unit 82 provided between the DIW supply source 72 and the second valve 62 to measure a flow rate of DIW.

The flow rate regulator 90 includes a first flow rate regulator 91 and a second flow rate regulator 92. The first flow rate regulator 91 is provided at an upstream side of the first valve 61 and a downstream side of the first measuring unit 81, and regulates the flow rate of DHF by regulating an opening degree of the flow path of DHF according to the control of the controller 18A of the control device 4A. The second flow rate regulator 92 is provided at an upstream side of the second valve 62 and a downstream side of the second measuring unit 82, and regulates the flow rate of DIW by regulating an opening degree of the flow path of DIW according to the control of the controller 18A.

Here, an initial opening degree is set in the first flow rate regulator 91 and the second flow rate regulator 92. The initial opening degree refers to an opening degree prior to the start of the series of substrate processings. When the flow paths of DHF and DIW are opened prior to the start of the series of substrate processings, the rise of the ejection flow rate may be accelerated, compared to a case where the flow paths of DHF and DIW are opened after the start of the series of substrate processings.

Returning to FIG. 9, the controller 18A will be described. When the controller 18A functions as the data collecting unit 18d, the controller 18A performs an information accumulating processing based on the measurement result of the measuring unit 80 in the storage unit 19A. Specifically, the controller 18A collects the monitoring result by the monitoring unit 18b and stores the collected monitoring result as accumulated data 19b in the storage unit 19A.

The monitoring result by the monitoring unit 18b includes, for example, a time from opening of the first valve 61 to reaching to the target integrated amount (hereinafter, referred to as a "first actual elapsed time"), a time from opening of the second valve 62 to reaching to the target integrated amount (hereinafter, referred to as a "second actual elapsed time"), and a time from reaching of DHF to the target integrated amount to reaching of DIW to the target integrated amount (hereinafter, referred to as an "actual supply time"). The controller 18A stores these data as accumulated data 19b for each processing unit 16A in the storage unit 19A. In addition, the controller 18A may perform this processing, for example, whenever the series of substrate processings are ended.

The controller 18A also performs a processing of generating various statistic values from the monitoring result accumulated in the storage unit 19A and storing the statistic values as accumulated data 19b. The statistic values include, for example, a maximum value, a minimum value, and a difference therebetween, an average value, and a standard deviation with respect to each of the above-described first actual elapsed time, second actual elapsed time, and actual supply time. The controller 18A stores these data as accumulated data 19b for each processing unit 19A in the storage unit 19A. In addition, the controller 18A may perform this processing whenever the series of substrate processings are ended, whenever a predetermined number of days are elapsed, or whenever the number of wafers W to be processed reaches a predetermined number of wafers W.

In addition, the controller 18A may perform a processing of displaying the accumulated data 19b stored in the storage unit 19A in a display unit (not illustrated). The display unit may be provided in the substrate processing system 1 or a terminal connected to the substrate processing system 1 through, for example, a network, other than the substrate processing system 1. For example, based on the accumulated data 19b, the controller 18A may produce a graph representing a change with time elapse such as, for example, the first actual elapsed time or the actual supply time for each processing unit 163A and display the graph in a display unit.

Figure 11:
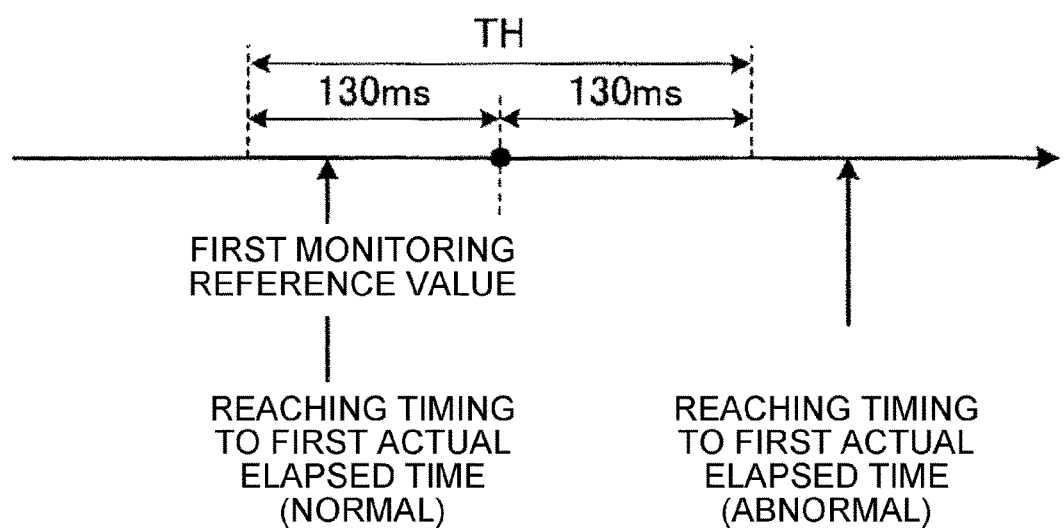
FIG. 11 is an explanatory view of a case where a controller functions as a monitoring unit according to the second exemplary embodiment.

Subsequently, a case where the controller 18A functions as the monitoring unit 18b will be described with reference to FIG. 11. FIG. 11 is an explanatory view of a case where the controller 18A functions as the monitoring unit 18b.

As illustrated in FIG. 11, the controller 18A monitors a deviation between the first actual elapsed time and a first monitoring reference value, and determines presence/non-presence of abnormality in the processing fluid supply unit 40 based on the monitoring result.

Specifically, the controller 18A determines whether the measured first actual elapsed time is within a normal range (TH) which is based on the first monitoring reference value. The normal range TH is, for example, a range of ±130 msec based on the first monitoring reference value. That is, the controller 18A determines whether the deviation between the measured first actual elapsed time and the first monitoring reference value is within 130 msec.

For example, when it is determined that the first actual elapsed time is within the normal range TH, the controller 18A makes a normality determination normality which means that no abnormality exists. Meanwhile, when it is determined that the first actual elapsed time exceeds the normal range TH, the controller 18A makes an abnormality determination which means that abnormality exists. In this case, the controller 18A outputs an alarm to an output device such as, for example, a display unit, or performs a predetermined processing performed when an abnormality determination is made such as, for example, stopping a substrate processing.

As described above, the controller 18 according to the second exemplary embodiment performs a processing of renewing the first monitoring reference value based on the accumulated data 19b. Accordingly, a deterioration of accuracy in determining abnormality due to, for example, aging of the processing unit 16A may be suppressed.

Here, the first actual elapsed time and the first monitoring reference value are described as an example, but the controller 18A may perform the same processing as described above by using the second actual elapsed time and a second monitoring reference value.

Subsequently, a case where the controller 18A functions as the initial opening degree changing unit 18e will be described. When functioning as the initial opening degree changing unit 18e, the controller 18A performs a processing of changing an initial opening degree of the flow rate regulator 90 based on the accumulated data 19b stored in the storage unit 19A.

For example, as described above, the storage unit 19A stores therein the average value of the first actual elapsed time as the accumulated data 19b. For example, the controller 18A determines whether the average value of the first actual elapsed time exceeds a predetermined threshold value. When it is determined that the average value exceeds the predetermined threshold value, the controller 18A performs a processing of increasing the initial opening degree of the first flow rate regulator 91.

The prolongation of the first actual elapsed time occurs due to, for example, aging of the first valve 61. When it is determined that the average value of the first actual elapsed time exceeds the predetermined threshold value, i.e., when the first elapsed time is prolonged, the controller 18A performs a processing of increasing the initial opening degree of the first flow rate regulator 91.

When the initial opening degree of the first flow rate regulator 91 is increased, the flow rate of DHF may be increased immediately after the opening of the first valve 61 so that the time required for the rise of DHF, i.e., the first actual elapsed time may be reduced, compared to a case where the initial opening degree is not changed.

Thus, even when the first actual elapsed time is prolonged due to, for example, aging of the first valve 61, the first actual elapsed time may be reduced without, for example, replacement of the first valve 61.

In addition, the controller 18A may perform the processing of determining whether the average value of the first actual elapsed time exceeds the predetermined threshold value, for example, whenever the series of substrate processings are ended, whenever the number of wafers W to be processed reaches a predetermined number of wafers W, or whenever a predetermined number of days are elapsed.

Here, it is determined whether the average value of the first actual elapsed time exceeds the predetermined threshold value, but the controller 18A may perform the determination processing based on other information stored as accumulated data 19b. In addition, the information of the initial opening degree may be stored in the storage unit 19A.

In addition, here, the processing of regulating the initial opening degree of the first flow rate regulator 91 is described, but a processing of regulating an initial opening degree of the second flow rate regulator 92 may be performed in the same manner as described above.

Figure 12:
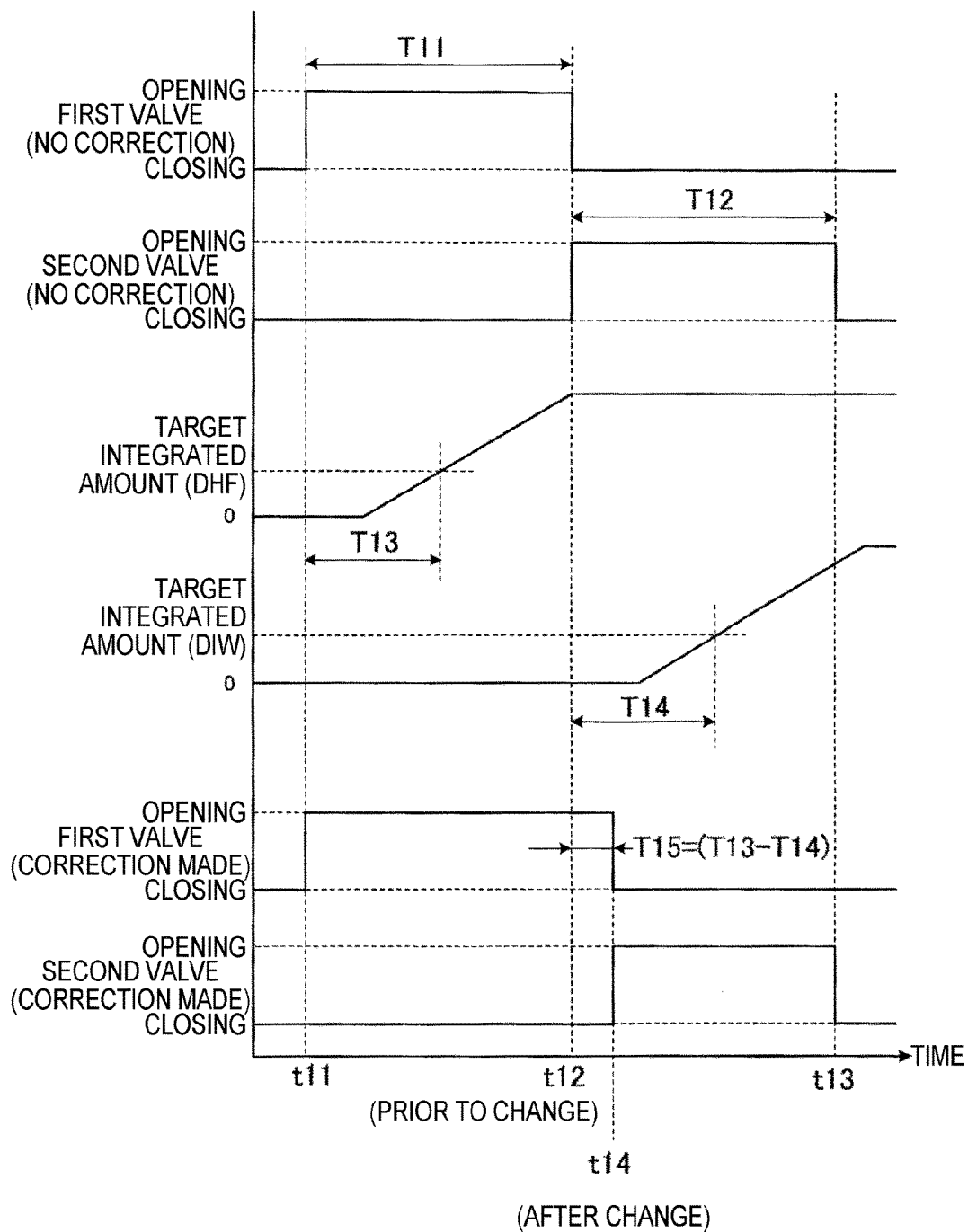
FIG. 12 is a (first) explanatory view of a case where the controller functions as an output timing changing unit according to the second exemplary embodiment.

Subsequently, a case where the controller 18A functions as the output timing changing unit 18c will be described. FIG. 12 is a (first) explanatory view of a case where the controller 18A functions as the output timing changing unit 18c.

Here, the upper portion of FIG. 12 represents the opening/closing state of the first valve 61 and the second valve 62 in a case where the output timing change processing by the output timing changing unit 18c for the first valve 61 is not performed. The middle portion of FIG. 12 represents integrated amounts of DHF and DIW. The lower portion of FIG. 12 represents opening and closing timings of the first valve 61 and the second valve 62 in a case where the output timing change processing by the output timing changing unit 18c is performed.

As illustrated in FIG. 12, the recipe information 19a includes a timing t11 of outputting an opening operation signal to open the first valve 61, a timing t12 of outputting a closing operation signal to close the first valve 61, a timing t13 of outputting an opening operation signal to open the second valve 62, and a timing t14 of outputting a closing operation signal to close the second valve 62.

Hereinafter, the time from the timing t11 to the timing t12 will be referred to a DHF ejection setting time T11, and the time from the timing t13 to the timing t14 will be referred to as a DIW ejection setting time T12. The DHF ejection setting time T11 is, for example, a DHF ejection time when it is assumed that DHF is ejected from a nozzle 41 simultaneously with the opening of the first valve 61, and the ejection of DHF from the nozzle 41 is stopped simultaneously with the closing of the first valve 61.

In addition, here, the descriptions are made in consideration of a case where the supply of DIW is started simultaneously with the stop of the supply of DHF, i.e., a case where the timing of outputting the closing operation signal to the first valve 61 and the timing of outputting the opening operation signal to the second valve 62 are the same. However, the timings may not be necessarily the same. For example, the opening operation signal may be output to the second valve 62 after elapse of a predetermined time from the output of the closing operation signal to the first valve 61. In suppressing a variation of an amount of etching by DHF, it is not necessarily required to start the supply of DIW simultaneously with the stop of the supply of DHF.

As described above, a predetermined time (a first actual elapsed time T13) is required from the timing t11 until DHF begins to be ejected from the nozzle 41 (until DHF reaches the wafer W), and a predetermined time (a second actual elapsed time T14) is also required from the timing t12 until DHF is no longer ejected from the nozzle 41 (until DHF no longer reaches the wafer W). The first actual elapsed time T13 and the second actual elapsed time T14 are not necessarily constant, and vary depending on, for example, aging. Hence, the actual ejection time of DHF may be reduced or prolonged depending on the variation of the first actual elapsed time T13 and the second actual elapsed time T14, compared to the DHF ejection setting time T11. Since the ejection time of DHF affects a degree of the processing of the wafer W, it is required to suppress the variation of the ejection time of DHF if possible.

Thus, in the second exemplary embodiment, the timing of outputting the opening operation signal and the closing operation signal to the valve 60 is changed so as to make constant the actual ejection time of DHF, regardless of the first actual elapsed time T13 or the second actual elapsed time T14. Specifically, the controller 18A changes the timing t12 among the timing t11, the timing t12, and the timing t13 which are defined by the recipe information 19a by using the first actual elapsed time T13 and the second actual elapsed time T14.

First, the controller 18A calculates a difference between the first actual elapsed time T13 and the second actual elapsed time T14 as a regulation time T15. Then, the controller 18A makes the timing t12 deviated by the regulation time T15.

For example, when the first actual elapsed time T13 is longer than the second actual elapsed time T14, the actual ejection time of DHF becomes shorter than the DHF ejection setting time T11. In this case, the controller 18A outputs the closing operation signal to the first valve 61 as late as the regulation time T15 which corresponds to the difference between the first actual elapsed time T13 and the second actual elapsed time T14 (timing t14). As a result, the actual ejection time of DHF may conform to the DHF ejection setting time T11.

In addition, in the second exemplary embodiment, only the timing t12 is changed without changing the timing t11 and the timing t13. Thus, the reduction of throughput may be suppressed, compared to a case of simply extending the processing time.

Further, when the timing t12 is delayed by the regulation time T15, the ejection time of DIW is reduced by the regulation time T15. However, since the regulation time T15 is merely about 100 msec to 200 msec, it is hard to cause the problem that DHF on the wafer W is not sufficiently washed away.

As the first actual elapsed time T13 which is used for the calculation of the regulation time T15, for example, a first actual elapsed time T13 measured in a current substrate processing may be used. In addition, as the second actual elapsed time T14 which is used for the calculation of the regulated time T15, for example, a second actual elapsed time T14 measured in a previous substrate processing may be used. The second actual elapsed time T14 measured in the previous substrate processing is stored as accumulated data 19b in the storage unit 19A. In addition, without being limited to the calculation described above, the controller 18A may calculate the regulation time T15 by using the average value of the first actual elapsed time and the average value of the second actual elapsed time which are stored as accumulated data 19b in the storage unit 19A.

Figure 13:
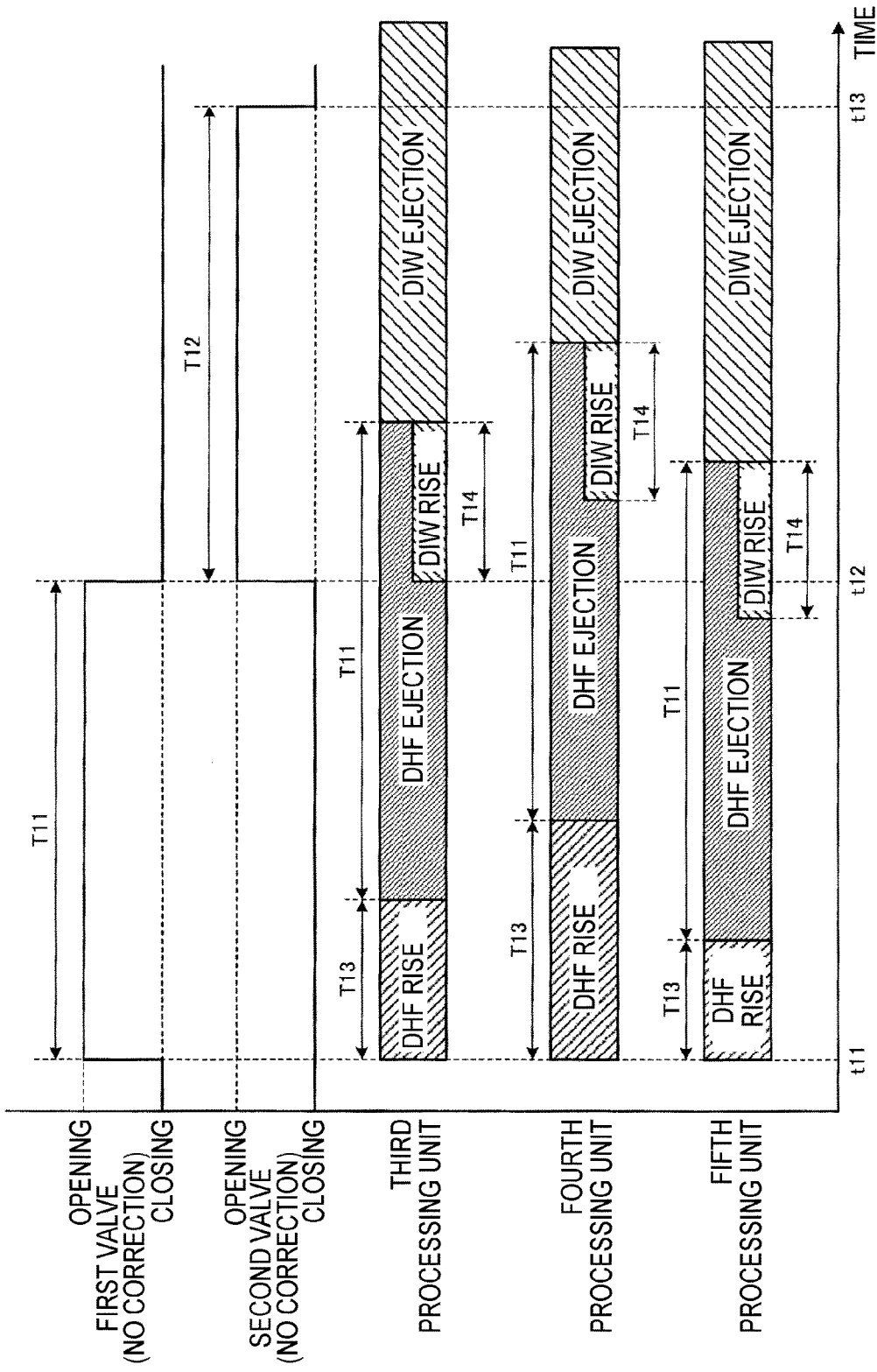
FIG. 13 is a (second) explanatory view of the case where the controller functions as the output timing changing unit according to the second exemplary embodiment.

FIG. 13 is a (second) explanatory view of a case where the controller 18A according to the second exemplary embodiment functions as the output timing changing unit 18c.

As illustrated in FIG. 13, the controller 18A performs the output timing change processing, i.e., the above-described processing of changing the timing t12 for each processing unit 16A.

For example, FIG. 13 represents an example of ejection timings of DHF and DIW for a third processing unit 16A_3 of which the first actual elapsed time T13 and the second actual elapsed time T14 are the same, i.e., the regulation time T15 is zero (0), a fourth processing unit 16A_4 of which the first actual elapsed time T13 is longer than the second actual elapsed time T14, i.e., the regulation time T15 is positive, and a fifth processing unit 16A_5 of which the first actual elapsed time T13 is shorter than the second actual elapsed time T14, i.e., the regulation time T15 is negative.

As described above, the first actual elapsed time T13 and the second actual elapsed time T14 may vary depending on each processing unit 16A. However, even when such a variation has occurred, the controller 18A according to the second exemplary embodiment may make constant the ejection time of DHF, i.e., the time from the timing when DHF reaches the wafer W until DHF no longer reaches the wafer W. Hence, a variation of an etching processing among the processing units 16A may be suppressed. In other words, uniformity of an etching processing among wafers W may be improved. Further, the result of the output timing changing processing is applied to a processing of the next wafer W.

As described above, the controller 18A according to the second exemplary embodiment measures an actual elapsed time from the output of the opening operation signal until the integrated amount reaches the preset target integrated amount, and monitors a deviation between the measured actual elapsed time and a preset target elapsed time corresponding to the target integrated amount to perform the output timing change processing to change the timing of outputting the closing operation signal from a preset timing based on the deviation.

In addition, in the substrate processing system 1 according to the second exemplary embodiment, a plurality of chambers 20 (in other words, the processing units 16A) is provided, and the controller 18A changes the timing of outputting the closing operation signal in the plurality of chambers 20 so as to make constant the time from the reaching to the wafer W until the output of the closing operation signal among the nozzles 41 of the plurality of chambers 20.

In addition, in the substrate processing system 1 according to the second exemplary embodiment, the processing fluid includes DHF (corresponding to an example of a chemical liquid) and DIW (corresponding to an example of a rinse liquid), and the valve 60 further includes the first valve 61 that opens/closes the flow path of DHF, and the second valve 62 that opens/closes the flow path of DIW liquid. In addition, the controller 18A supplies DHF and DIW in this order to the wafer W by outputting the opening operation signal and the closing operation signal to the first valve 61 and the second valve 62 at a preset timing. Then, the controller 18A changes the timing of outputting the closing operation signal to the first valve 61 in the plurality of chambers 20 so as to make constant the time from the reaching of DHF to the wafer W until the output of the closing operation signal among the nozzles 41 of the plurality of chambers 20.

In addition, DHF and DIW are continuously supplied from the nozzles 41, and the controller 18A measures the actual elapsed time of the second valve 62 from the output of the opening operation signal to the second valve 62 until the integrated amount reaches the preset target flow rate, and monitors a deviation between the measured actual elapsed time of the second valve 62 and a target elapsed time of the second valve 62 corresponding to the target integrated amount to change the timing of outputting the opening operation signal to the second valve 62.

Thus, according to the substrate processing system 1 of the second exemplary embodiment, the time from the reaching of the processing liquid to the wafer W to the non-reaching thereto may be made constant among the nozzles 41 while suppressing the reduction of throughput. As a result, a variation of an etching amount among wafers W may be suppressed when, for example, DHF is supplied as a processing liquid.

In addition, the substrate processing system 1 according to the second exemplary embodiment includes the storage unit 19A, and the controller 18A accumulates information based on the measurement result of the measuring unit 80 in the storage unit 19A. Thus, for example, the information accumulated in the storage unit 18A may be provided as log information. In addition, by displaying the accumulated information in a display unit, the accumulated information may be used for, for example, the flow rate monitoring.

In addition, the controller 18A performs the processing of accumulating, in the storage unit 19A, the actual elapsed time until the integrated amount according to the rise of the supply flow rate reaches the preset target integrated amount, the processing of determining a monitoring reference value based on the actual elapsed time accumulated in the storage unit 19A, and the processing of monitoring a deviation between the actual elapsed time and the monitoring reference value. Thus, it is possible to monitor whether the rise of the processing fluid such as, for example, DHF or DIW is normal.

In addition, the controller 18A performs the processing of renewing the monitoring reference value when a predetermined renewal condition is met. Thus, the accuracy in determining abnormality of the rise of the processing fluid such as, for example, DHF or DIW may be suppressed from being deteriorated due to, for example, aging of the processing unit 16A.

In addition, the substrate processing system 1 according to the second exemplary embodiment includes the storage unit 19A, the flow rate regulator 90, and the controller 18A. The storage unit 1 stores the integrated amount therein. The flow rate regulator 90 is provided at the upstream side of the valve 60 to regulate the flow rate of the processing fluid flowing in the flow path. The controller 18A controls the flow rate regulator 90 to open the flow path in the initial opening degree prior to the supply of the processing fluid to the nozzle 41, and regulate the opening degree of the flow path to reach the preset flow rate during the supply of the processing fluid to the nozzle 41. In addition, the controller 18A performs the processing of accumulating, in the storage unit 19A, the actual elapsed time from the output of the opening operation signal until the integrated amount reaches the preset target integrated amount, and the processing of changing the initial opening degree of the flow rate regulator based on the actual elapsed time accumulated in the storage unit 19A after the supply of the processing fluid to the nozzle 41.

Thus, even when the actual elapsed time is prolonged due to, for example, aging of the valve 60, the actual elapsed time may be reduced without, for example, replacement of the valve 60.

In the above-described exemplary embodiments, the case where the output timing changing processing is performed in the nozzles 41 of the processing units 16 (in other words, the chambers 20) is described as an example. However, the exemplary embodiments may be applied to a plurality of nozzles 41 within a single chamber 20.

That is, when at least two nozzles 41 are provided in a single chamber 20, the above-described output timing change processing may be performed in the plurality of nozzles 41 within the chamber 20.

In addition, in the above-described exemplary embodiments, DHF is described as an example of the chemical liquid. Besides, however, for example, SC1, SC2, SPM, a resist, a developer, a silylation agent, and ozone water may be used as the chemical liquid.

In addition, the rinse liquid also is not limited to the above-described DIW. For example, when the contents of the rinse processing include a processing of supplying DIW to a wafer W and a processing of substituting DIW on the wafer W with isopropyl alcohol (IPA), the rinse liquid also includes the IPA.

The above-described exemplary embodiments have been described mainly with reference to the rise of the ejection flow rate as an example. However, the fall of the ejection flow rate may be monitored likewise. When the fall is monitored, it is possible to control, for example, the opening/closing of the valve 60 such that the processing liquid is ejected to the wafer W always in a constant amount and for constant time, for example, by detecting a deviation from the above-described target integrated amount.

In addition, the above-described exemplary embodiments have been described mainly with reference to the liquid processing fluid as an example. However, when, for example, N2 gas which is a kind of inert gas is used in, for example, the dry processing, and the gas is supplied from a nozzle 41, the above-described exemplary embodiments may be applied to the rise or the fall of a supply flow rate of the gas.

The above-described exemplary embodiments have been described with reference to the case where the workpiece is a wafer W as an example. However, the above-described exemplary embodiments may be generally applied to a processing apparatus which performs a processing on a workpiece by supplying a processing fluid to the workpiece.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus comprising:
   at least one chamber configured to accommodate a workpiece to be processed therein;
   at least one nozzle provided in the chamber to supply a processing fluid toward the workpiece;
   a measuring unit configured to measure a supply flow rate of the processing fluid supplied to the nozzle;
   an opening/closing unit configured to perform opening/closing of a flow path of the processing fluid to be supplied to the nozzle; and
   a controller configured to output, at a preset timing, an opening operation signal to cause the opening/closing unit to perform an opening operation and a closing operation signal to cause the opening/closing unit to perform a closing operation,
   wherein, after outputting the opening operation signal, the controller calculates an integrated amount of the processing fluid based on a measurement result of the measuring unit when the supply flow rate reaches a preset flow rate, and performs an output timing change processing to change a timing of outputting at least one of a subsequent opening operation signal or closing operation signal from the preset timing based on the calculated integrated amount, wherein the integrated amount of the processing fluid corresponds to a preset target integrated amount of the processing fluid, which is the amount of processing fluid required to reach a surface of the workpiece, and
   wherein the controller measures an actual elapsed time between the output of the opening operation signal and when the integrated amount reaches the preset target integrated amount, and monitors a deviation between the measured actual elapsed time and a preset target elapsed time corresponding to the target integrated amount to perform the output timing change processing based on the deviation.

2. The processing apparatus of claim 1, wherein a plurality of chambers is provided, and the controller changes the timing of outputting the opening operation signal in the plurality of chambers so as to make constant a time from the output of the opening operation signal until a reaching timing when the processing fluid reaches a surface of the workpiece among nozzles of the plurality of chambers.

3. The processing apparatus of claim 1, wherein a plurality of chambers are provided, and the controller determines one of the nozzles provided in the plurality of chambers, which exhibits the latest reaching timing when the processing fluid reaches the surface of the workpiece after the output of the opening operation signal, as a reference nozzle, and delays the timing of outputting the subsequent opening operation signal based on the deviation so as to make the reaching timing of each of the other nozzles conform to the reaching timing of the reference nozzle.

4. The processing apparatus of claim 1, wherein a plurality of chambers are provided, and the controller determines one of the nozzles provided in the plurality of chambers, which exhibits the earliest reaching timing when the processing fluid reaches the surface of the workpiece after the output of the opening operation signal, as a reference nozzle, and advances the timing of outputting the subsequent opening operation signal based on the deviation so as to make the reaching timing of each of the other nozzles conform to the reaching timing of the reference nozzle.

5. The processing apparatus of claim 1, wherein the controller measures an actual elapsed time from the output of the opening operation signal until the integrated amount reaches the preset target integrated amount, and monitors a deviation between the measured actual elapsed time and a preset target elapsed time corresponding to the target integrated amount to perform the output timing change processing based on the deviation to change the timing of outputting the subsequent closing operation signal from the preset timing.

6. The processing apparatus of claim 5, wherein a plurality of chambers are provided, and the controller changes the timing of outputting the subsequent closing operation signal in the plurality of chambers so as to make constant a time from the reaching of the processing fluid to the surface of the workpiece until the output of the closing operation signal among nozzles of the plurality of chambers.

7. The processing apparatus of claim 6, wherein the processing fluid includes a chemical liquid and a rinse liquid, the opening/closing unit further includes a first valve configured to open and close a flow path of the chemical liquid and a second valve configured to open and close a flow path of the rinse liquid, and the controller supplies the chemical liquid and the rinse liquid in this order to the workpiece in one of the plurality of chambers by outputting the opening operation signal and the closing operation signal to the first valve and the second valve at the preset timing, and changes the timing of outputting the subsequent closing operation signal to the first valve in the remaining plurality of chambers so as to make constant the time from the reaching of the chemical liquid to the workpiece until the output of the closing operation signal among the nozzles of the plurality of chambers.

8. The processing apparatus claim 7, wherein the chemical liquid and the rinse liquid are continuously supplied from the nozzles, and the controller measures an actual elapsed time of the second valve from output of the opening operation signal to the second valve until the integrated amount reaches a preset target integrated amount, and monitors a deviation between the measured actual elapsed time of the second valve and a target elapsed time of the second valve corresponding to the target integrated amount to change the timing of outputting the subsequent opening operation signal to the second valve.

9. The processing apparatus of claim 1, further comprising:
   a storage unit configured to store the integrated amount; and
   a flow rate regulator provided at an upstream side of the opening/closing unit to regulate the flow rate of the processing fluid flowing the flow path,
   wherein the controller controls the flow rate regulator to open the flow path in an initial opening degree prior to the supply of the processing fluid to the nozzle and to regulate the opening degree of the flow path to reach the preset flow rate during the supply of the processing fluid to the nozzle, and performs a processing of accumulating, in the storage unit, the actual elapsed time from the output of the opening operation signal until the integrated amount reaches the preset target integrated amount, and performs a processing of changing a subsequent initial opening degree of the flow rate regulator based on the actual elapsed time accumulated in the storage unit after the supply of the processing fluid to the nozzle.

10. A processing method using a processing apparatus that includes a chamber configured to accommodate a workpiece therein, at least one nozzle provided in the chamber to supply a processing fluid toward the workpiece, a measuring unit configured to measure a supply flow rate of the processing fluid to be supplied to the nozzle, and an opening/closing unit configured to perform opening/closing of a flow path of the processing fluid to be supplied to the nozzle, the processing method comprising: a controlling step of outputting an opening operation signal to cause the opening/closing unit to perform an opening operation and a closing operation signal to cause the opening/closing unit to perform a closing operation, at a preset timing, wherein, after outputting the opening operation signal, the controlling step includes:

calculating an integrated amount of the processing fluid based on a measurement result of the measuring unit when the supply flow rate reaches a preset flow rate, and performing an output timing change processing to change a timing of outputting the opening operation signal or the closing operation signal from the preset timing based on the calculated integrated amount, wherein the integrated amount of the processing fluid corresponds to a preset target integrated amount of the processing fluid, which is the amount of processing fluid required to reach a surface of the workpiece, and wherein, the performing an output timing change processing includes measuring an actual elapsed time between outputting the opening operation signal and the integrated amount reaching the preset target integrated amount, and monitoring a deviation between the measured actual elapsed time and a preset target elapsed time corresponding to the target integrated amount to perform the output timing change processing based on the deviation.

11. A non-transitory computer-readable storage medium which is operated on a computer and stores a program for controlling a processing device, wherein the program, when executed, causes the computer to control the processing apparatus to perform the processing method of claim 10.

\* \* \* \* \*